US009117495B2

(12) United States Patent
Siau et al.

(10) Patent No.: US 9,117,495 B2
(45) Date of Patent: Aug. 25, 2015

(54) GLOBAL BIT LINE PRE-CHARGE CIRCUIT THAT COMPENSATES FOR PROCESS, OPERATING VOLTAGE, AND TEMPERATURE VARIATIONS

(71) Applicant: UNITY SEMICONDUCTOR CORPORATION, Sunnyvale, CA (US)

(72) Inventors: Chang Hua Siau, Saratoga, CA (US); Bruce Lynn Bateman, Fremont, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 179 days.

(21) Appl. No.: 13/935,105

(22) Filed: Jul. 3, 2013

(65) Prior Publication Data

US 2013/0294136 A1    Nov. 7, 2013

Related U.S. Application Data

(63) Continuation-in-part of application No. 13/134,579, filed on Jun. 10, 2011, now Pat. No. 8,891,276.

(60) Provisional application No. 61/668,378, filed on Jul. 5, 2012.

(51) Int. Cl.
*G11C 5/06*     (2006.01)
*G11C 5/08*     (2006.01)
(Continued)

(52) U.S. Cl.
CPC .. *G11C 5/06* (2013.01); *G11C 5/08* (2013.01); *G11C 7/00* (2013.01); *G11C 7/04* (2013.01);
(Continued)

(58) Field of Classification Search
CPC .. G11C 5/06; G11C 13/0004; G11C 13/0026; G11C 13/0011; G11C 13/0007; G11C 7/12; G11C 7/18; G11C 16/24; G11C 13/0069; G11C 13/004; G11C 13/0023; G11C 2213/71; G11C 7/00; G11C 5/08; G11C 7/04
USPC ................. 365/63, 66, 148, 158, 189.08, 203
See application file for complete search history.

(56) References Cited

U.S. PATENT DOCUMENTS 5,483,482 A   1/1996  Yamada et al.
5,991,193 A   11/1999 Gallagher et al.
(Continued)

OTHER PUBLICATIONS

Abelmann et al., "Self-assembled three-dimensional non-volatile memories," Micromachines 2010, vol. 1, pp. 1-18, Jan. 18, 2010. 18 pages.
(Continued)

*Primary Examiner* — Toan Le
(74) *Attorney, Agent, or Firm* — Stolowitz Ford Cowger LLP

(57) ABSTRACT

A memory array includes wordlines, local bitlines, two-terminal memory elements, global bitlines, and local-to-global bitline pass gates and gain stages. The memory elements are formed between the wordlines and local bitlines. Each local bitline is selectively coupled to an associated global bitline, by way of an associated local-to-global bitline pass gate. During a read operation when a memory element of a local bitline is selected to be read, a local-to-global gain stage is configured to amplify a signal on or passing through the local bitline to an amplified signal on or along an associated global bitline. The amplified signal, which in one embodiment is dependent on the resistive state of the selected memory element, is used to rapidly determine the memory state stored by the selected memory element. The global bit line and/or the selected local bit line can be biased to compensate for the Process Voltage Temperature (PVT) variation.

18 Claims, 23 Drawing Sheets

(51) Int. Cl.
*G11C 7/00* (2006.01)
*G11C 7/18* (2006.01)
*G11C 13/00* (2006.01)
*G11C 7/04* (2006.01)
*G11C 7/12* (2006.01)
*G11C 16/24* (2006.01)

(52) U.S. Cl.
CPC .. *G11C 7/12* (2013.01); *G11C 7/18* (2013.01);
*G11C 13/004* (2013.01); *G11C 13/0004*
(2013.01); *G11C 13/0007* (2013.01); *G11C 13/0011* (2013.01); *G11C 13/0023* (2013.01);
*G11C 13/0069* (2013.01); *G11C 16/24*
(2013.01); *G11C 13/0026* (2013.01); *G11C 2213/71* (2013.01)

(56) References Cited

U.S. PATENT DOCUMENTS

| | | | |
|---|---|---|---|
| 6,034,882 A | 3/2000 | Johnson et al. | |
| 6,128,214 A | 10/2000 | Kuekes et al. | |
| 6,185,122 B1 | 2/2001 | Johnson et al. | |
| 6,204,139 B1 | 3/2001 | Liu et al. | |
| 6,351,406 B1 | 2/2002 | Johnson et al. | |
| 6,385,074 B1 | 5/2002 | Johnson et al. | |
| 6,407,953 B1 | 6/2002 | Cleeves | |
| 6,420,215 B1 | 7/2002 | Knall et al. | |
| 6,459,095 B1 | 10/2002 | Heath et al. | |
| 6,473,332 B1 | 10/2002 | Ignatiev et al. | |
| 6,504,753 B1 | 1/2003 | Scheuerlein et al. | |
| 6,515,888 B2 | 2/2003 | Johnson et al. | |
| 6,515,904 B2 | 2/2003 | Moore et al. | |
| 6,522,594 B1 | 2/2003 | Scheuerlein | |
| 6,525,953 B1 | 2/2003 | Johnson | |
| 6,534,403 B2 | 3/2003 | Cleeves | |
| 6,545,891 B1 | 4/2003 | Tringali et al. | |
| 6,569,745 B2 | 5/2003 | Hsu | |
| 6,599,796 B2 | 7/2003 | Mei et al. | |
| 6,631,085 B2 | 10/2003 | Kleveland et al. | |
| 6,642,539 B2 | 11/2003 | Ramest et al. | |
| 6,693,821 B2 | 2/2004 | Hsu et al. | |
| 6,759,249 B2 | 7/2004 | Zhuang et al. | |
| 6,777,248 B1 | 8/2004 | Nabatame et al. | |
| 6,816,410 B2 | 11/2004 | Kleveland et al. | |
| 6,822,903 B2 | 11/2004 | Scheuerlein et al. | |
| 6,836,421 B2 | 12/2004 | Rinerson et al. | |
| 6,850,455 B2 | 2/2005 | Rinerson et al. | |
| 6,859,382 B2 | 2/2005 | Rinerson et al. | |
| 6,882,553 B2 | 4/2005 | Nejad et al. | |
| 6,917,539 B2 | 7/2005 | Rinerson et al. | |
| 6,927,430 B2 | 8/2005 | Hsu | |
| 6,937,505 B2 | 8/2005 | Morikawa | |
| 6,940,113 B2 | 9/2005 | Hsu et al. | |
| 6,940,744 B2 | 9/2005 | Rinerson et al. | |
| 6,970,375 B2 | 11/2005 | Rinerson et al. | |
| 7,001,846 B2 | 2/2006 | Hsu | |
| 7,009,909 B2 | 3/2006 | Rinerson et al. | |
| 7,020,006 B2 | 3/2006 | Chevallier et al. | |
| 7,022,572 B2 | 4/2006 | Scheuerlein et al. | |
| 7,023,743 B2 | 4/2006 | Nejad et al. | |
| 7,046,550 B1 | 5/2006 | Reohr et al. | |
| 7,057,914 B2 | 6/2006 | Rinerson et al. | |
| 7,079,442 B2 | 7/2006 | Rinerson et al. | |
| 7,141,481 B2 | 11/2006 | Hsu et al. | |
| 7,177,181 B1 | 2/2007 | Scheuerlein | |
| 7,256,415 B2 | 8/2007 | Furukawa et al. | |
| 7,339,811 B2 | 3/2008 | Nejad et al. | |
| 7,372,753 B1 | 5/2008 | Rinerson et al. | |
| 7,379,364 B2 | 5/2008 | Siau et al. | |
| 7,394,680 B2 | 7/2008 | Toda et al. | |
| 7,405,960 B2 | 7/2008 | Cho et al. | |
| 7,411,811 B2 | 8/2008 | Inoue | |
| 7,417,271 B2 | 8/2008 | Genrikh et al. | |
| 7,443,711 B1 | 10/2008 | Stewart et al. | |
| 7,463,546 B2 | 12/2008 | Fasoli et al. | |
| 7,498,600 B2 | 3/2009 | Cho et al. | |
| 7,505,344 B2 | 3/2009 | Scheuerlein | |
| 7,508,695 B2 | 3/2009 | Sugita | |
| 7,608,467 B2 | 10/2009 | Wu et al. | |
| 7,639,521 B2 | 12/2009 | Baek et al. | |
| 7,643,344 B2 | 1/2010 | Choi | |
| 7,701,791 B2 | 4/2010 | Rinerson et al. | |
| 7,706,177 B2 | 4/2010 | Petti | |
| 7,719,876 B2 | 5/2010 | Chevallier et al. | |
| 7,733,685 B2 | 6/2010 | Scheuerlein et al. | |
| 7,742,323 B2 | 6/2010 | Rinerson et al. | |
| 7,782,650 B2 | 8/2010 | Bertin et al. | |
| 7,842,991 B2 | 11/2010 | Cho et al. | |
| 7,884,349 B2 | 2/2011 | Rinerson et al. | |
| 7,897,951 B2 | 3/2011 | Rinerson | |
| 7,898,841 B2 | 3/2011 | Chevallier et al. | |
| 7,902,867 B2 | 3/2011 | Mouttet | |
| 7,902,868 B2 | 3/2011 | Norman | |
| 7,955,871 B2 | 6/2011 | Wu et al. | |
| 7,983,065 B2 | 7/2011 | Samachisa | |
| 8,139,409 B2 | 3/2012 | Chevallier et al. | |
| 8,547,720 B2* | 10/2013 | Samachisa et al. | 365/51 |
| 8,891,276 B2* | 11/2014 | Siau et al. | 365/63 |
| 2001/0055838 A1 | 12/2001 | Walker et al. | |
| 2003/0003675 A1 | 1/2003 | Hsu | |
| 2004/0109353 A1 | 6/2004 | Matsuoka | |
| 2004/0170040 A1 | 9/2004 | Rinerson et al. | |
| 2005/0269626 A1 | 12/2005 | Forbes | |
| 2006/0131695 A1 | 6/2006 | Kuekes et al. | |
| 2006/0171200 A1 | 8/2006 | Rinerson | |
| 2008/0068875 A1 | 3/2008 | Choi | |
| 2008/0090401 A1 | 4/2008 | Bratkovski et al. | |
| 2008/0157127 A1 | 7/2008 | Bertin et al. | |
| 2008/0278989 A1 | 11/2008 | Lee et al. | |
| 2009/0027976 A1 | 1/2009 | Rinerson et al. | |
| 2009/0154232 A1 | 6/2009 | Norman | |
| 2009/0302315 A1 | 12/2009 | Lee et al. | |
| 2010/0044666 A1 | 2/2010 | Baek et al. | |
| 2010/0067279 A1 | 3/2010 | Choi | |
| 2010/0073990 A1 | 3/2010 | Siau et al. | |
| 2010/0078759 A1 | 4/2010 | Sekar et al. | |
| 2010/0103724 A1 | 4/2010 | Kim et al. | |
| 2010/0110771 A1 | 5/2010 | Choi | |
| 2010/0134239 A1 | 6/2010 | Wu et al. | |
| 2010/0155686 A1 | 6/2010 | Bratkovski et al. | |
| 2010/0155722 A1 | 6/2010 | Meyer | |
| 2010/0157658 A1 | 6/2010 | Schloss | |
| 2010/0159641 A1 | 6/2010 | Rinerson | |
| 2010/0159688 A1 | 6/2010 | Rinerson et al. | |
| 2010/0161888 A1 | 6/2010 | Eggleston | |
| 2010/0195393 A1 | 8/2010 | Eggleston | |
| 2010/0202188 A1 | 8/2010 | Rinerson et al. | |
| 2010/0271885 A1 | 10/2010 | Schueuerlein et al. | |
| 2010/0278479 A1 | 11/2010 | Bratkovski et al. | |
| 2010/0290294 A1 | 11/2010 | Siau | |
| 2011/0006275 A1 | 1/2011 | Roelofs et al. | |
| 2011/0017977 A1 | 1/2011 | Bratkovski et al. | |
| 2011/0024710 A1 | 2/2011 | Bratkovoski et al. | |
| 2011/0024716 A1 | 2/2011 | Bratkovski et al. | |
| 2011/0059576 A1 | 3/2011 | Cho et al. | |
| 2011/0188281 A1 | 8/2011 | Siau et al. | |
| 2011/0188282 A1 | 8/2011 | Chevallier et al. | |
| 2011/0188283 A1 | 8/2011 | Chevallier et al. | |
| 2011/0188284 A1 | 8/2011 | Chevallier et al. | |
| 2011/0297927 A1 | 12/2011 | Ramaswamy et al. | |
| 2012/0012897 A1 | 1/2012 | Besser et al. | |
| 2012/0314468 A1 | 12/2012 | Siau | |

OTHER PUBLICATIONS

Baek et al., "Realization of Vertical Resistive Memory (VRRAM) using cost effective 3D Process," IDEM 2011, 31 8.1, pp. 737-740. 4 pages.

Bateman, Bruce, U.S. Appl. No. 13/210,292, filed Aug. 15, 2011, re Filed Application with Figures. 88 pages.

Chevallier et al., "A 0.13um 64Mb Multi-Layered Conductive Metal-Oxide Memory," ISSCC 2010/ Session 14/ Non-Volatile Memory/ 14.3, pp. 260-261. 2 pages.

(56) References Cited

OTHER PUBLICATIONS

Dong et al., "Si/a-Si Core/Shell Nanowires as Nonvolatile Crossbar Switches," Nano Letters 2008, vol. 8, No. 2, pp. 861-391. 6 pages.

Ou et al., "Array Architecture for a Nonvolatile 3-Dimensional Cross-Point Memory," Doctoral Dissertation, Stanford University, Mar. 2010, pp. 1-119. 119 pages.

Ou et al., "Array Architecture for a Nonvolatile 3-Dimensional Cross-Point Resistance-Change Memory," IEEE Journal of Solid-State Circuits, vol. 46, No. 9, Sep. 2011.

Jang et al., "Vertical Cell Array using TCAT (Terabit Cell Array Transistor) Technology for Ultra High Density NAND Flash Memory," 2009 Symposium on VLSI Technology Digest of Technical Papers, pp. 192-193. 2 pages.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137. 2 pages.

Kim et al., "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, pp. 186-187. 2 pages.

Kim et al., "Multi-Layered Vertical Gate NAND Flash Overcoming Stacking Limit for Terabit Density Storage," 2009 VLSI Symposium on VLSI Technology Digest of Technical Papers, Jun. 16-18, 2009, pp. 188-189. 2 pages.

Krieger, Ju H., "Principle Operation of 3-D Memory Device based on Piezoacousto Properties of Ferroelectric Films," InTech, Dec. 2010, pp. 3-16. 14 pages.

Kwong et al., "Vertical Silicon Nanowire Platform for Low Power Electronics and Clean Energy Applications," May 25, 2011, Journal of Nanotechnology, vol. 2012, Article ID 492121. 21 pages.

Lue et al., "A Highly Scalable 8-Layer 3D Vertical-Gate (VG) TFT NAND Flash Using Junction-Free Buried Channel BE-SONOS Device," 2010 Symposium on VLSI Technology, Jun. 15-17, 2010, pp. 131-132. 2 pages.

Parrillo, Louis, U.S. Appl. No. 13/250,772, filed Sep. 30, 2011, re Filed Application with Figures. 63 pages.

Siau, Chang, U.S. Appl. No. 13/134,589, filed Jun. 10, 2011, re Filed Application with Figures. 73 pages.

Strachan et al., "The switching location of a bipolar memristor: chemical, thermal and structural mapping," Nanotechnology 22 (2011) 254015, pp. 1-6. 7 pages.

Wu, Jian, U.S. Appl. No. 13/250,923, filed Sep. 30, 2011, re Filed Application with Figures. 44 pages.

Yoon et al., "Vertical Cross-point Resistance Change Memory for Ultra-High Density Non-volatile Memory Applications," 2009 Symposium on VLSI Technology Digest of Technical Papers, pp. 26-27. 2 pages.

Zhang et al., "A 3D RRAM Using Stackable 1TXR Memory Cell for High Density Application," IEEE Xplore, Feb. 5, 2010, pp. 917-920. 4 pages.

\* cited by examiner

GLOBAL BIT LINE PRE-CHARGE CIRCUIT THAT COMPENSATES FOR PROCESS, OPERATING VOLTAGE, AND TEMPERATURE VARIATIONS

PRIORITY

This application is a continuation-in-part of U.S. patent application Ser. No. 13/134,579 filed on Jun. 10, 2011, now issued as U.S. Pat. No. 8,891,276 on Nov. 18, 2014, entitled MEMORY ARRAY WITH LOCAL BITLINES AND LOCAL-TO-GLOBAL BITLINE PASS GATES AND GAIN STAGES, and this application claims benefit of U.S. Provisional Application No. 61/668,378 filed on Jul. 5, 2012, entitled: GLOBAL BIT LINE PRE-CHARGE CIRCUIT THAT COMPENSATES FOR PROCESS, OPERATING VOLTAGE, AND TEMPERATURE VARIATIONS, each of which is incorporated herein by reference in its entirety.

COPYRIGHT NOTICE

© 2013 Rambus, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all rights whatsoever available under 37 CFR §1.71(d).

FIELD OF THE INVENTION

The present invention relates generally to memory. More particularly, the present invention relates to non-volatile memory arrays and to methods and apparatus for performing data operations on memory elements of non-volatile memory arrays.

BACKGROUND

Flash memory is a type of non-volatile memory (NVM) used extensively as secondary storage and long-term persistent storage of electronic data. It is also widely used to store firmware of computers (e.g., the basic input-output operating system (BIOS) of personal computers) and other electronic devices. In addition to being non-volatile, Flash memory is electrically re-writable and requires no moving parts. These attributes have made Flash memory popular for use in portable and battery-powered electronic devices, such as tablet and notebook computers, cell phones, smart phones, personal digital assistants, digital audio players and digital cameras.

Increased processing capability and sophistication of computers and other electronic devices in recent years has led to an increase in demand for higher-capacity Flash memory. To fulfill this demand, Flash memory manufacturers have increased capacity by scaling down the dimensions of the individual memory elements of the Flash memory so that a higher density of memory elements can be formed per given area of a memory array.

The memory elements in Flash memory comprise floating gate transistors formed in a semiconducting material. Each floating gate transistor has a floating gate disposed over a thin tunnel dielectric layer between the drain and source of the transistor. The floating gate transistor is programmed by injecting charge carriers (i.e., electrons) through the thin tunnel dielectric layer and into the floating gate. It is erased by removing charge carriers from the floating gate through the thin tunnel dielectric layer by a process known as quantum tunneling. Only so many of these program and erase (P/E) cycles can be performed before the thin tunnel dielectric layer wears out and the floating gate transistor is no longer able to reliably store charge. The number of P/E cycles that floating gate transistors can endure decreases with scaling, and in recent years there has been shown to be a fundamental limit to the extent to which floating gate transistors can be scaled without suffering data retention problems. Further, a Flash memory cell requires at least three terminals to access the memory cell for a data operation (e.g., a P/E cycle or a read operation). Moreover, Flash memory requires a Flash operating system (Flash OS) and requires an erase operation (e.g., a block erase operation) prior to a write operation, thereby increasing write latency times for write operations.

Alternative NVM technologies that avoid the scaling limits of Flash memory have been proposed. Some of these alternative NVM technologies have shown promise. However, various challenges exist to combining the memory elements of these alternative technologies in a high-capacity memory array.

It would be desirable, therefore, to have high-capacity, re-writable, non-volatile two-terminal cross-point memory arrays that are based on alternative NVM technologies and which avoid the scaling limits and other limitations associated with Flash memory, such as an erase operation prior to a write operation and requiring more than two-terminals to access a memory cell for a data operation.

BRIEF DESCRIPTION OF THE DRAWINGS

The invention and its various embodiments are more fully appreciated in connection with the following detailed description taken in conjunction with the accompanying drawings, in which.

Figure 1:
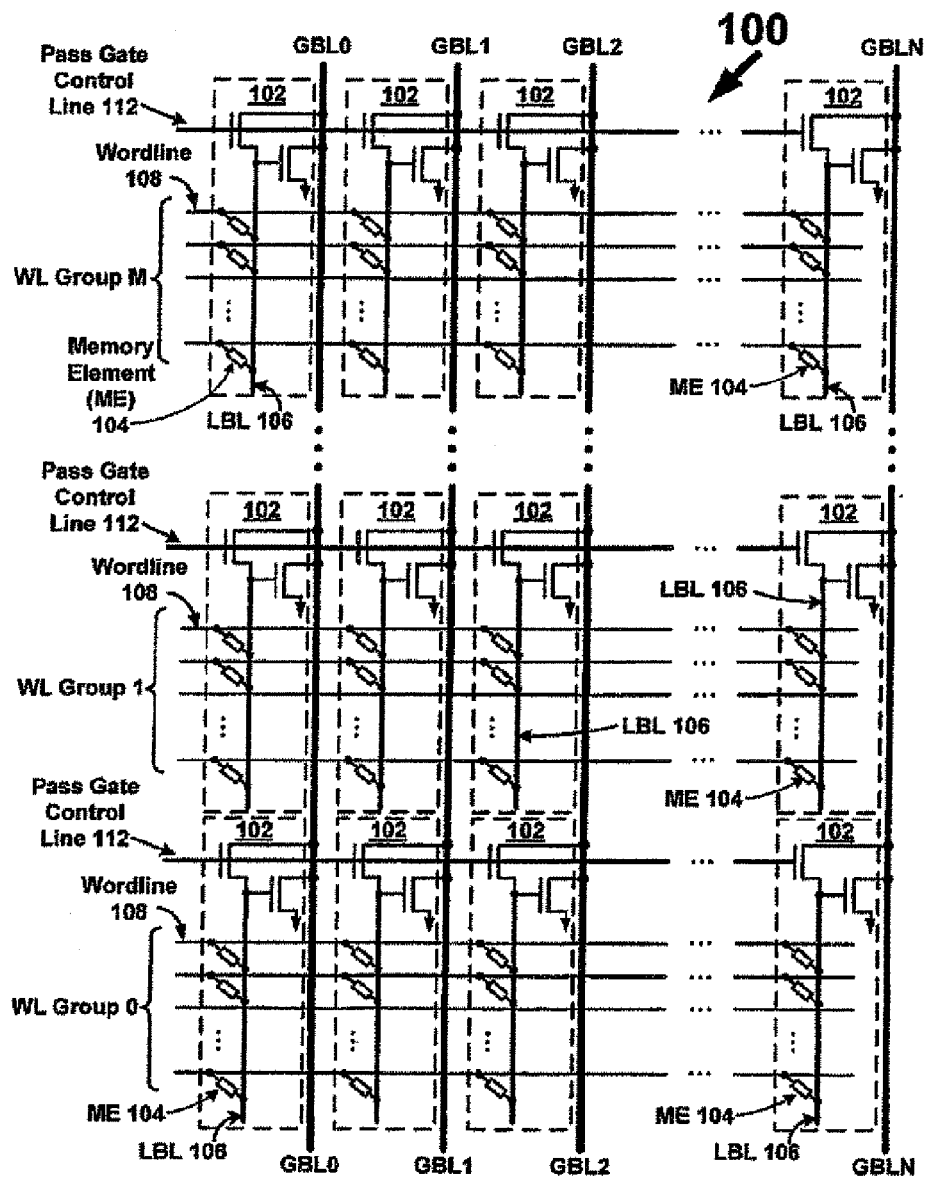
FIG. 1 is a schematic drawing depicting a memory array, according to an embodiment of the present invention.

Like reference numerals refer to corresponding parts throughout the several views of the drawings. Note that most of the reference numerals include one or two left-most digits that generally identify the figure that first introduces that reference number. The depictions in the various drawing figures are not necessarily to scale.

DETAILED DESCRIPTION

Two-terminal cross-point memory arrays employing discrete re-writeable non-volatile two-terminal memory elements are disclosed. An exemplary memory array includes a plurality of wordlines (WLs), a plurality of local bitlines (LBLs), a plurality of discrete re-writeable non-volatile two-terminal memory elements formed between the WLs and LBLs, a plurality of switching devices that selectively electrically couple the plurality of LBLs to a plurality of global bitlines (GBLs), and a plurality of amplifiers (e.g., gain stages) configured between the plurality of LBLs and the plurality of GBLs. Hereinafter, the discrete re-writeable non-volatile two-terminal memory elements will be referred to as memory element or memory elements.

During times when a selected memory element is being programmed or erased, the LBL associated with the selected memory element is electrically coupled with an associated GBL via one of the switching devices. During times when a selected memory element is being read, the switching device associated with the LBL is switched opened so that the LBL is electrically isolated from its associated GBL, and a read voltage is then applied across the selected memory element. The applied read voltage causes current to flow through the selected memory element and charge the capacitance of the LBL to a local bit line voltage. The local bit line voltage depends on the memory state of the selected memory element and is amplified by the gain stage and conducted along the GBL that is associated with the LBL. The amplified current, or other related signal on the GBL, is then sensed by a sense amplifier or measured by some other measuring circuit, to determine the stored memory state of the selected memory element. In addition to performing an amplifying function, the gain stage serves to isolate the capacitances of the LBL from the much larger capacitance of the associated GBL. Together, the amplification and isolation functions of the amplifiers allow data to be read from the memory array at a high rate.

According to one aspect of the invention, the plurality of switching devices, plurality of amplifiers, plurality of GBLs, and other supporting logic used to exercise and control the operation of the memory array are formed in a semiconductor substrate or in a semiconductor epitaxial layer, in accordance with a front-end-of-the-line (FEOL) integrated circuit manufacturing process (e.g., a complementary metal-oxide-semiconductor (CMOS) process). The WLs, LBLs, and memory elements of the memory array are not formed in the semiconductor substrate or semiconductor epitaxial layer. Rather, they are formed in a plurality of WL, LBL, and memory layers directly above the semiconductor substrate or semiconductor layer, in accordance with a back-end-of-the-line (BEOL) process. The resulting integrated circuit (IC) comprises a single semiconductor die that includes a FEOL circuitry portion and a BEOL memory portion that is in direct contact with and is fabricated directly above the FEOL circuitry portion such that the semiconductor die is a monolithically fabricated unitary whole. The BEOL memory portion includes one or more BEOL memory layers. With multiple BEOL memory layers, each memory layer is in contact with an adjacent memory layer and the multiple layers are vertically stacked upon one another. A plurality of electrically conductive vias are formed through the various layers (e.g., FEOL and BEOL layers) to electrically couple the plurality of WLs and LBLs to the switching devices, amplifiers, plurality of GBLs, and supporting logic in the underlying FEOL semiconductor substrate or semiconductor epitaxial layer. Forming the memory array in this manner allows the memory elements of the memory array to be tightly integrated and vertically stacked in multiple memory layers, resulting in a high-storage density, high-capacity, three-dimensional memory array that avoids the scaling limits of floating-gate-transistor-based Flash memory.

Referring to FIG. 1 there is shown a memory array 100, according to an embodiment of the present invention. The memory array 100 comprises a plurality of memory array portions 102, each associated with one of (M+1) wordline (WL) groups and one of N+1 global bitlines (GBLs) GBL0, GBL1, . . . , GBLN, where M and N are integers greater than or equal to zero. As can be observed in the more detailed drawing of the memory array portion 102 in FIG. 2, each memory array portion 102 includes a local bitline (LBL) 106, a pass gate transistor 204, and a gain stage transistor 206. K+1 memory elements 104 are coupled between each LBL 106 and K+1 WLs 108 of an associated WL group, where K is an integer greater than or equal to zero. The number of memory elements 104 per LBL 106 is set during design and determined by a number of factors, including but not limited to: overall memory array size, required operation parameters, program and/or erase operation parameters, type of memory elements 104 used, inter-element parasitic resistances and capacitances on the LBL 106, resistance and capacitance of the LBL's associated GBL, and the transconductance of the gain stage transistor 206, for example. Examples of operation parameters include but are not limited to read current, write current, program current, erase current, read speed, write speed, read disturb, write disturb, and half-select ratios, just to name a few.

Using LBLs and the pass gate and gain stage transistors 204 and 206 (e.g., pass gate/gain stage block 202) reduces loading on the GBLs during data operations on memory elements 104 in the array 100 and minimizes interferences on the GBLs attributable to other memory elements 104 in the array 100 that are not selected for the data operation (e.g., half-selected memory elements 104). As will be described in more detail below, an LBL 106 of a given memory array portion 102 is electrically coupled to its associated GBL by way of its pass gate 204 when a memory element 104 positioned between a selected WL 108 and the LBL 106 is being written to (e.g., is being programmed or erased). The LBL's pass gate 204 is turned on by applying a pass gate control signal along a pass gate control signal line 112 electrically coupled with the gate of the pass gate 204.

In one embodiment of the invention, the gain stage transistor 206 of each LBL 106 is configured as a common source amplifier. The function of the gain stage transistor 206 is twofold: first, to isolate the capacitances of its LBL 106 from the capacitance of the LBL's associated GBL during read operations, and second, to amplify a signal that develops on the LBL 106 during read operations of a selected memory element to an amplified signal on or along the associated GBL. The amplified signal is representative of the stored memory state of the selected memory element 104. Together, this twofold function results in a faster read speed than can be realized in the absence of the gain stage transistor 206.

It should be mentioned that whereas a single-transistor amplifier is used to implement the gain stage 206 of each pass gate/gain stage 202 in the exemplary embodiments of the inventions described herein, other amplifying structures, e.g., amplifiers having more than one transistor and/or amplifiers of types other than a source amplifier, may be used as alternatives. Further, whereas a pass gate transistor 204 is used to implement the switching device between an LBL 106 and its associated GBL, any suitable switching device may be used.

Figure 3:
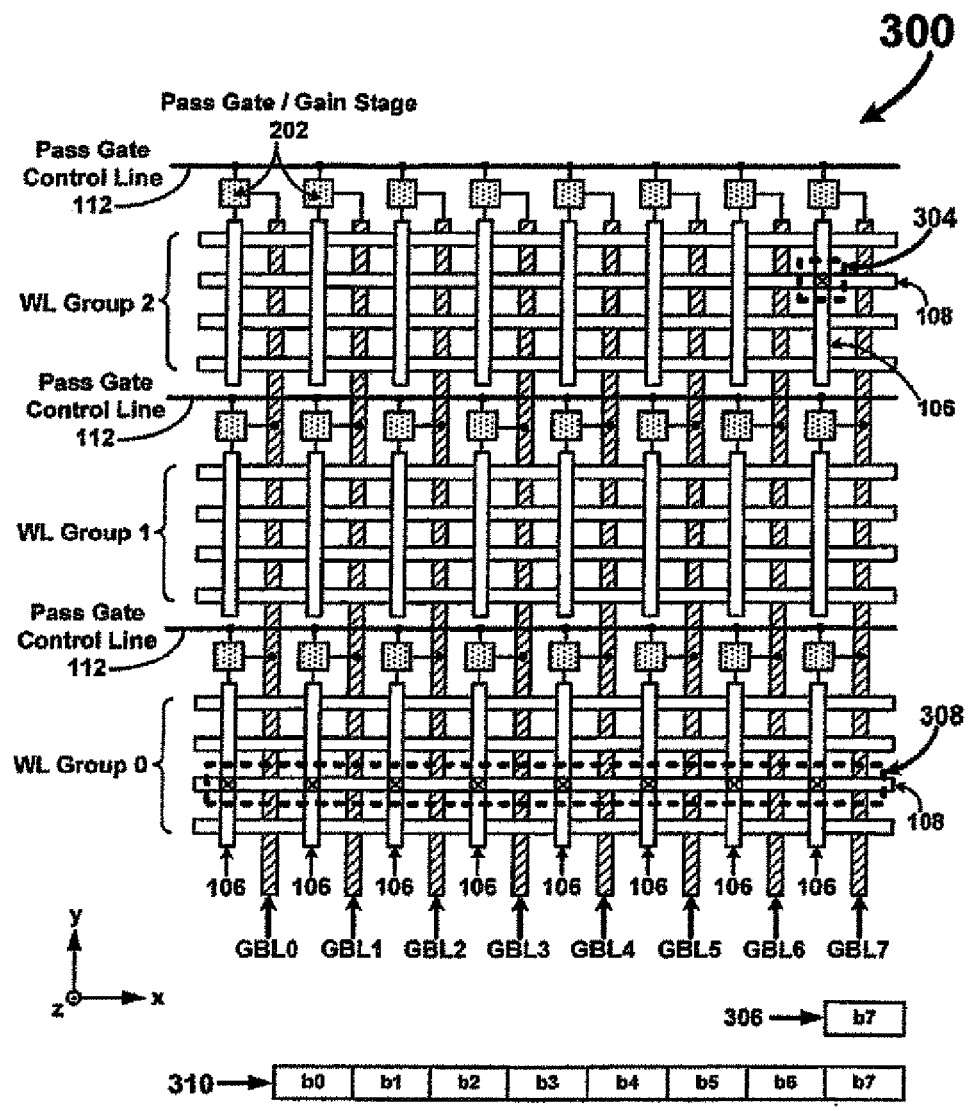
FIG. 3 is a plan view drawing depicting a single-layer memory array, according to an embodiment of the present invention.

FIG. 3 is a plan view of a physical implementation of a memory array 300, according to an embodiment of the invention. (Note that to avoid unnecessary obfuscation, the depiction of the memory array 300 includes only three WL groups and only three LBLs 106 per GBL. In an actual implementation there would typically be many more WL groups and many more LBLs per GBL (e.g., hundreds of LBLs per GBL). The memory array 300 is arranged in a "cross-point" configuration such that WLs 108 of WL Groups: WL Group 0, WL Group 1 and WL Group 2 extend horizontally (e.g., in the x-direction) as rows in a first x-y plane (e.g., in a "WL layer"). The LBLs 106 extend vertically (e.g., in the y-direction) as columns in a second x-y plane (e.g., in an "LBL layer") above and/or below the WL layer. And memory elements 104 are formed between each intersecting WL and LBL (e.g., positioned between a cross-point of a WLs 108 with a LBL 106). In other embodiments, WLs 108 can extend vertically in the y-direction and LBLs 106 can extend horizontally in the x-direction (not shown).

The GBLs: GBL0, GBL1, . . . , GBLN, and the transistors used to implement the pass gates/gain stage blocks 202 are formed FEOL beneath the BEOL WL, LBL, memory elements, and memory layer(s) in a semiconductor substrate or in a semiconductor epitaxial layer grown on a substrate, along with transistors and other circuit elements used to form the sense and control circuitry for the memory array 300, and optionally circuitry for other purposes such as a micro-controller (μC), a microprocessor (μP), FPGA, digital signal processor (DSP), state machine, just to name a few.

The LBLs 106, WLs 108, and GBLs comprise conductive lines made from an electrically conductive material, such as a metal (e.g., aluminum, copper or tungsten), a metal alloy, or other non-metal conductive material such as a conductive ceramic or conductive metal oxide, for example.

In one embodiment of the invention, the memory elements 104 comprise two-terminal devices made from a material capable of storing two or more memory states, and are formed as memory "plugs" in a memory layer disposed between WL and LBL layers such that a memory element 104 is positioned at and between each intersection (e.g., a cross-point) of a WL 108 with its associated LBL 106.

Arranging the memory array 300 in this "cross-point" configuration maximizes memory density and affords the ability to read data from or write data to memory elements 104 on a single bit basis, or simultaneously on a nibble, byte, word, page, block, or other higher-bit basis. In FIG. 3, for example, an individual memory element 304 at the intersection of a WL 108 of WL Group 2 and an LBL 106 in GBL 7 is shown as being accessed during the reading or writing of a single bit of data b7, and a string of memory elements 308 at the intersections of a WL 108 of WL Group 0 and LBLs 106 in columns 0-7 is shown as being accessed during the reading or writing of a byte 310 of data b0, b1, . . . , b7. In some embodiments of the invention, erasing may also or alternatively be performed on a bit basis, a multiple-bit basis, a block basis, or a page basis, where a block comprise one or more pages and a page comprises a plurality of bytes, words or higher-bit group of memory elements 104 along multiple WLs. Furthermore, in some embodiments of the invention, a write operation to one or more memory elements 104 does not require a prior erase operation, unlike Flash memory.

Figure 4:
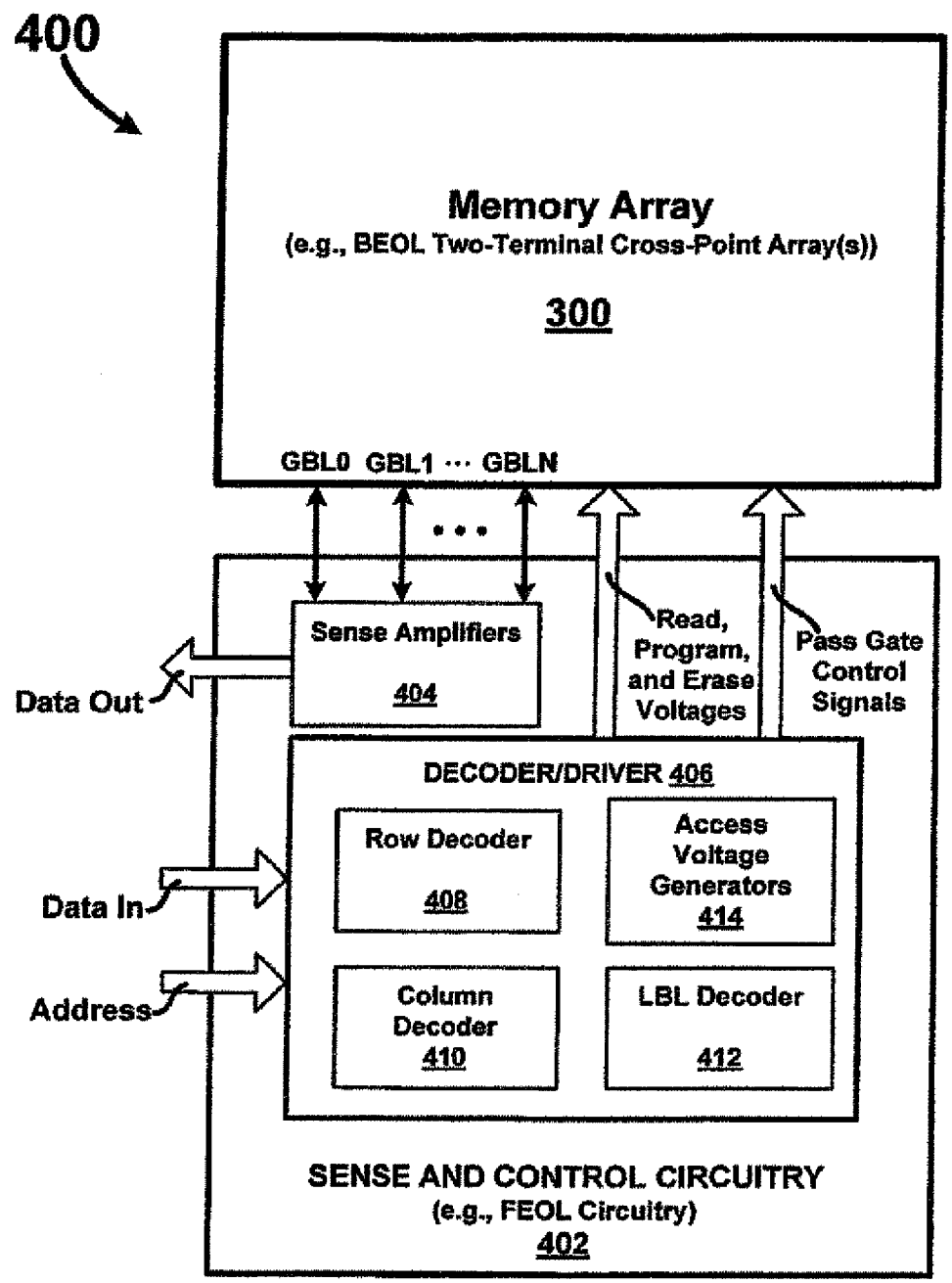
FIG. 4 is a block diagram depicting a memory, according to an embodiment of the present invention.

Memory elements 104 of the memory array 300 are selected to be read or written to under the control of sense and control circuitry 402, as illustrated in the block diagram of the memory 400 in FIG. 4. Examples of write operations include a program operation and an erase operation. The sense and control circuitry 402 includes sense amplifiers 404 and decoder/driver circuitry 406. The sense amplifiers 404 are coupled to the GBLs: GBL0, GBL1, . . . , GBLN of the memory array 300, and are used during read operations to sense currents or voltages indicative of data being stored (e.g., distinct resistive states) by the memory elements 104. The decoder/driver circuitry 406 includes a row decoder 408, column decoder 410, LBL decoder 412 and access voltage generators 414. The row and column decoders 408 and 410 are configured to decode addresses that identify memory elements 104 associated with one or more WLs (e.g., rows) and one or more GBLs (e.g., columns) in the array 300. The LBL decoder 412 is configured to generate the pass gate control signals for the pass gates 204 of the LBLs 106, depending on the address received by the decoder/driver circuitry 406.

As an example of how the decoder/driver circuitry 406 operates, consider a program operation in which an address received by the decoder/driver circuitry 406 identifies the string of memory elements 308 in FIG. 3 as the memory elements 104 to be programmed. Upon receiving the address, the row decoder 408 decodes a row-identifying portion of the address to select the appropriate WL 108 in WL Group 0 that intersects with the string of memory elements 308 and the column decoder 410 decodes a column-identifying portion of the address to determine the columns and GBLs associated with the string of memory elements 308. Meanwhile, also based on the received address, the LBL decoder 412 generates pass gate control signals for the pass gates 204 of the LBLs 106 associated WL Group 0. The pass gate control signals are routed along the pass gate control lines 112 to the gates of the pass gates 204 of the associated LBLs 106, turning the pass gates 204 on so that the associated LBLs 106 are electrically coupled with their respective GBLs during the program operation.

Access voltage generators 414 operate in cooperation with the row, column and LBL decoders 408, 410 and 412, to generate select voltages (e.g., read, program and erase voltages) for selected WLs, unselect voltages for unselected WLs, precharge voltages for the GBLs: GBL0, GBL1, . . . , GBLN, and bias voltages for the gain stage transistors 206. Further details of the read, program and erase operations are provided below.

Figure 5:
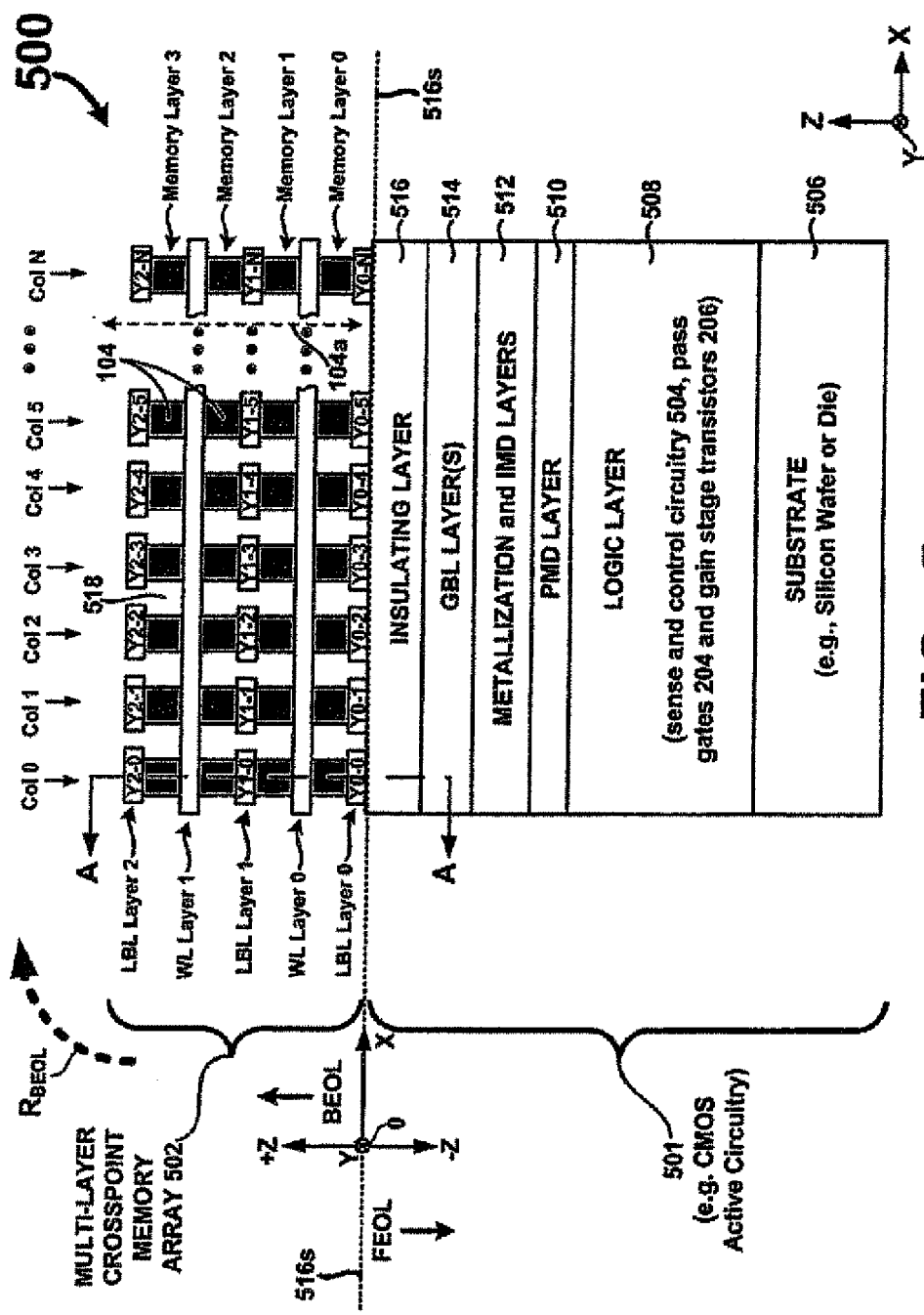
FIG. 5 is a cross-sectional drawing depicting a memory that includes a multi-layer cross-point memory array, according to an embodiment of the present invention.

The memory array 100 in FIG. 1 has (M+1) LBLs 106 per column, K+1 memory elements 104 per LBL 106, and (N+1) memory elements per row, resulting in a memory array having (K+1)(M+1)(N+1) memory elements 104. The total number of memory elements 104 in the memory array 100 can be further increased, without increasing the lateral (e.g., x-y) dimensions of the array, by "vertically stacking" LBLs 106, WLs 108 and associated memory elements 104 one over the other in the form of a multi-layer or three-dimensional cross-point memory array. This approach is illustrated in FIG. 5, which is a cross-sectional drawing of a memory 500 having a multi-layer cross-point memory array 502, in accordance with another embodiment of the present invention. The multi-layer cross-point memory array 502 in FIG. 5 has essentially the same lateral (e.g., x-y) dimensions as the single-layer cross-point memory array 100 in FIG. 1 but has four memory layers: Memory Layer 0, Memory Layer 1, Memory Layer 2, Memory Layer 3, instead of just one, resulting in an array 502 with four times as many memory elements 104 as the single-layer memory array 100 in FIG. 1. (It should be noted that whereas four memory layers: Memory Layer 0, Memory Layer 1, Memory Layer 2, Memory Layer 3 are shown and described in this exemplary embodiment, multi-layer cross-point memory arrays having two, three or more than four memory layers could also be made using the principles and concepts of the present invention and the number of memory elements per layer will be application dependent.)

Each of the memory layers: Memory Layer 0, Memory Layer 1, Memory Layer 2 is disposed between one of LBL Layers: LBL Layer 0, LBL Layer 1, LBL Layer 2, and one of WL Layers: WL Layer 0 and WL Layer 1. For example, Memory Layer 1 is disposed between WL Layer 0 and LBL Layer 1. LBLs in the LBL Layers: LBL Layer 0, LBL Layer 1, LBL Layer 2 are orthogonal to the WLs in the WL Layers: WL Layer 0 and WL Layer 1, so that a single memory element 104 is interposed between each crossing LBL and WL (e.g., ME 104 is positioned between a cross-point of a LBL and a WL).

To limit the x-y dimensions of the overall memory 500, the GBLs, the pass gates 204 and gain stage transistors 206 of the LBLs of the memory array 502 and all, substantially all, or a significant portion of the sense and control circuitry 504 are formed directly beneath the WL, LBL and memory layers of the memory array 502, specifically, in an underlying semiconductor substrate 506 (e.g., a silicon wafer or silicon die) or semiconductor epitaxial layer 508. The sense and control circuitry 504, GBLs, pass gates 204 and gain stage transistors 206 are fabricated in accordance with a front-end-of-the-line (FEOL) integrated circuit semiconductor manufacturing process, such as a complementary metal-oxide-semiconductor (CMOS) process. In one embodiment of the invention, a triple-well CMOS process is used. By forming the GBLs, pass gates 204 and gain stage transistors 206 of the LBLs of the memory array 502 and all, substantially all, or a significant portion of the sense and control circuitry 504 beneath the WL, LBL and memory layers of the memory array 502, more die per substrate (e.g., die per wafer) can be produced. Forming the memory 500 in this manner also frees up valuable silicon area for other circuitry, which can be especially desirable in embedded applications.

The WLs, memory elements 104 and LBLs of the cross-point memory array 502 are formed in a back-end-of-the-line (BEOL) process that follows prior FEOL processing. Specifically, in the BEOL process, alternating layers of WLs: WL Layer 0, WL Layer 1, memory layers: Memory Layer 0, Memory Layer 1, Memory Layer 2, Memory Layer 3, and LBLs: LBL Layer 0, LBL Layer 1, LBL Layer 2 are formed along the +Z axis (see FIG. 5) directly on top of the uppermost FEOL layer (e.g., an uppermost surface 516s of layer 516). The memory elements 104 in each of the memory layers: Memory Layer 0, Memory Layer 1, Memory Layer 2, Memory Layer 3 are electrically isolated from one another by intra-memory-element dielectric material 518 (e.g., silicon oxide or silicon nitride). The BEOL portions are not separate layers or structures that are connected with the FEOL portion using conventional processes such as wafer bonding, multi-chip modules, soldering, etc. Rather, the BEOL portions are fabricated (e.g., grown) directly on top of the FEOL portion such that the resulting memory 500 or other IC component comprises a single unitary die that can be subsequently singulated (e.g., sawed or cut from a silicon wafer) and optionally placed in a suitable IC package.

Figure 6:
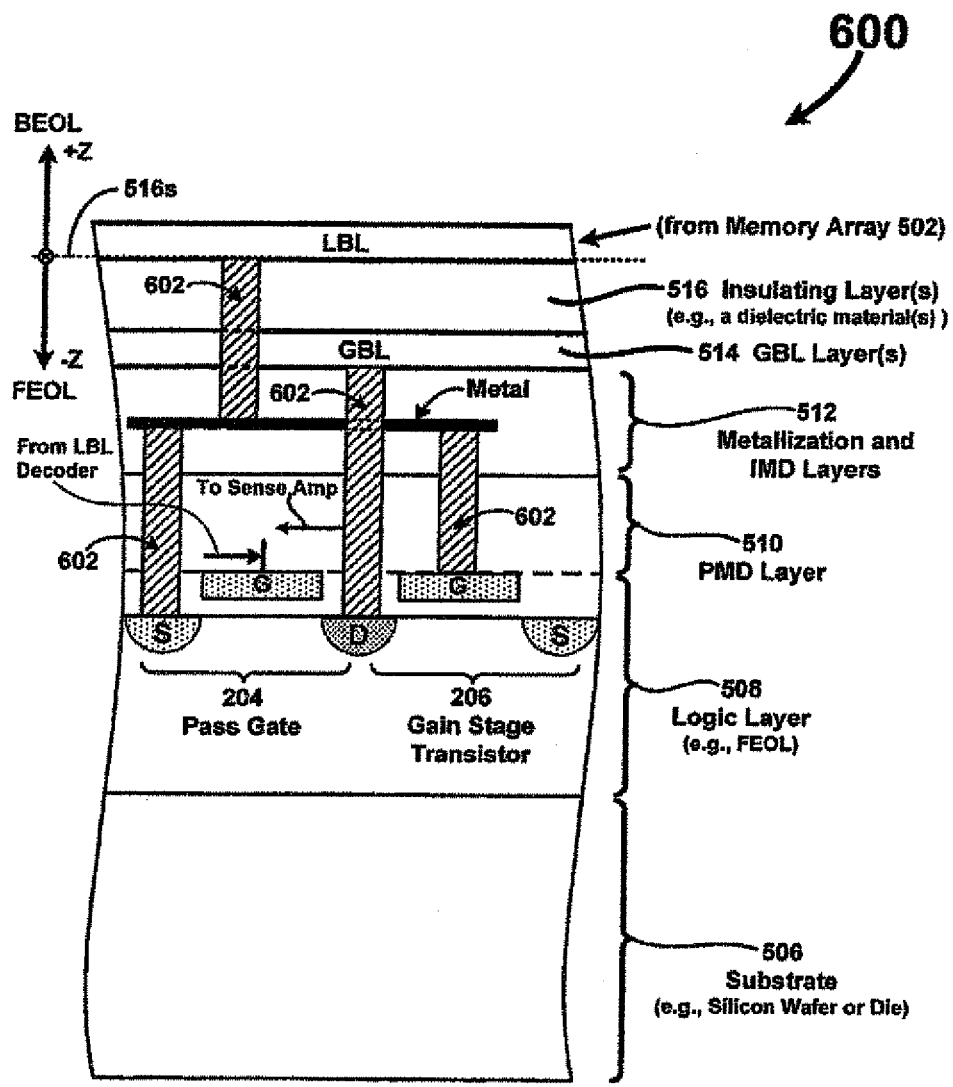
FIG. 6 is a section drawing depicting how conductive vias are formed and used to connect global bitlines (GBLs) and local bitlines (LBLs) of the memory array in FIG. 5 to logic circuitry formed in an underlying semiconductor layer.

In one embodiment, GBLs: GBL0, GBL1, . . . , GBLN of the memory array 502 are formed FEOL in one or more metal layers 514 above other FEOL structures such as pre-metal dielectric, metallization and inter-metal dielectric (IMD) layers 510 and 512 (as shown in FIG. 5). In other embodiments of the invention, the GBLs: GBL0, GBL1, . . . , GBLN are formed FEOL in one or more of the metallization layers of the metallization and IMD layers 512. In yet another embodiment, the GBLs: GBL0, GBL1, . . . , GBLN are formed BEOL in one or more metal layers above the uppermost WL and LBL layers of the memory array 502 (not shown). In embodiments where the GBLs: GBL0, GBL1, . . . , GBLN are formed FEOL in GBL layer(s) 514 (as in FIG. 5), the GBLs are electrically coupled with their associated sense amplifiers by one or more inter-layer interconnects (e.g., vias) 602 formed through the PMD, metallization and IMD layers 510 and 512, as illustrated in FIG. 6. Vias 602 are also formed through the various layers below the conductive WL and LBL layers, to electrically connect the WLs to the sense and control circuitry 504 and the LBLs to their associated pass gates 204 and gain stage transistors 206.

The configuration for the BEOL portion (e.g., portion along +Z axis above line 516s) depicted in FIG. 5 can have alternate orientations. For example, instead of the memory layers 0-3 being vertically stacked such that an axis 104s of the memory elements 104 is aligned with the Z-axis, the axis 104s can be rotated to align with the X-axis or the Y-axis. In FIG. 5, the direction for the Y-axis is into and out of the page of the drawing sheet. As one example of an alternative configuration for the BEOL portion, the entire BEOL portion can be rotated $R_{BEOL}$ 90 degrees (e.g., clockwise or counter clockwise) relative to the Z-axis such that axis 104a is aligned with the X-axis instead of the Z-axis. In this rotated configuration, the vias (e.g., 602) from the FEOL portion (e.g., portion along −Z axis below line 516s) can be configured to connect with the appropriate WLs and LBLs in the rotated configuration. In the rotated configuration, the WLs are aligned with the Z-axis and the memory layers 0-3 span left-to-right along the line 516s and are aligned with the X-axis in the same direction as the axis 104a of the memory elements 104. Another rotation can align the memory layers 0-3 and the axis 104a of the memory elements 104 with the Y-axis, for example. Therefore, the configuration of the structural elements of the BEOL portion are not limited to those depicted in FIG. 5 or other FIGS. herein and alternative configurations of the BEOL portion may be used.

Figure 7:
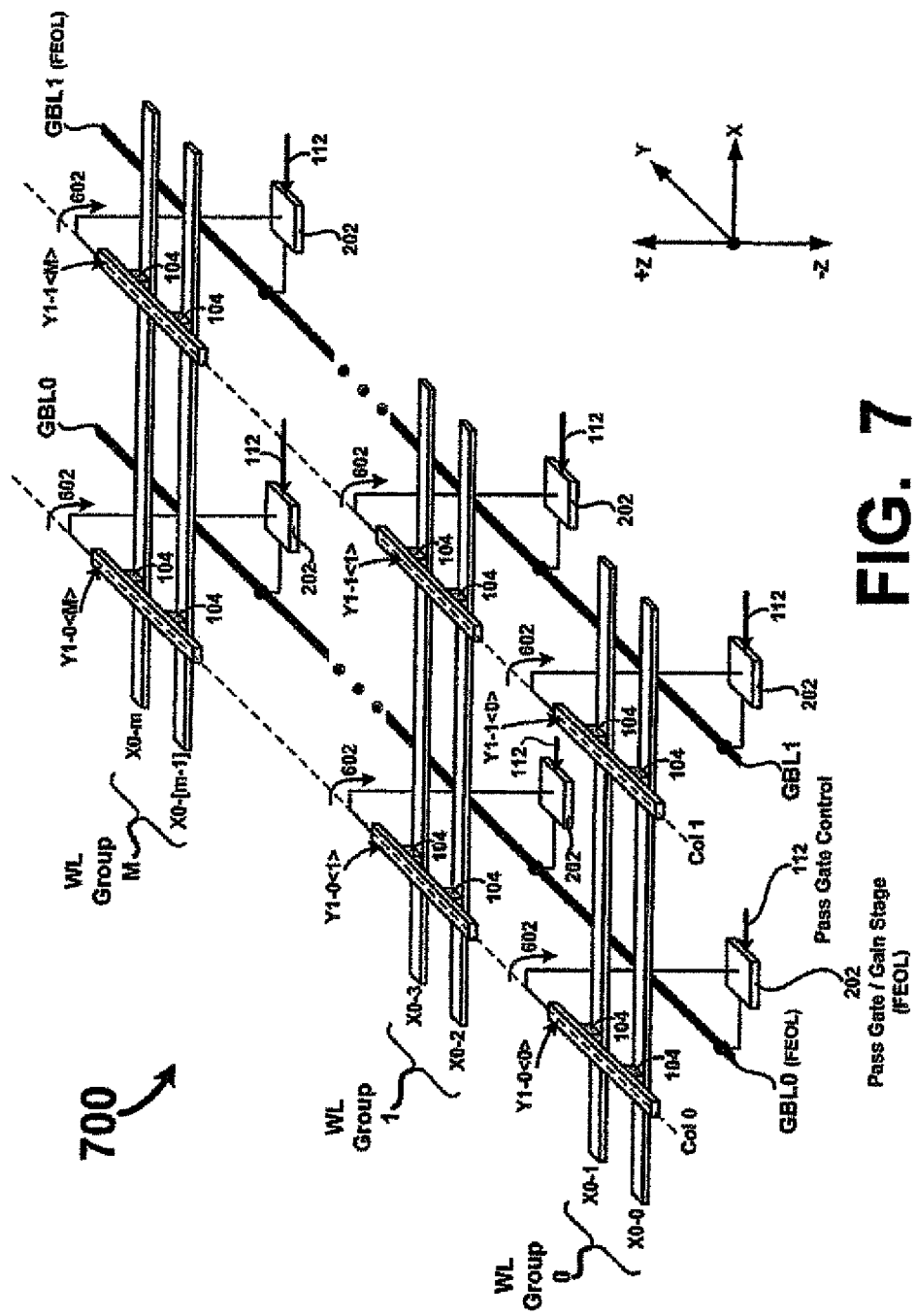
FIG. 7 is a perspective view depicting a section of Memory Layer 0 of the multi-layer cross-point memory array in FIG. 5 and associated LBLs, GBLs and WLs.

FIG. 7 is a perspective view of an array portion 700 of the multi-layer cross-point memory array 502 in FIG. 5, further illustrating the relationship among WLs, LBLs, GBLs and pass gate/gain stage blocks 202 of the memory array 502. The memory array portion 700 includes memory elements 104 from Col 0 and Col 1 of Memory Layer 1, which is disposed between WL Layer 0 and LBL Layer 1. WL Layer 0 includes WLs X0-0, X0-1, X0-3, . . . , X0-m, where the "0" next to the "Xs" is used to indicate that the WLs are from WL Layer 0 and m is a positive integer used to represent the total number of WLs in WL Layer 0 (and the other WL layers of the memory array 502). Two columns (Col 0 and Col 1) of LBL Layer 1 of the memory array 502 are included in the array portion 700. In this and subsequent drawings, the LBLs in Col 0 are identified using the nomenclature: Y1-0<0>, Y1-0<1> . . . Y1-0<M>, where the "1" in "Y1" is used to indicate that the LBLs are from LBL Layer 1, the "-0" is used to indicate that the LBLs are in Col 0, and, <0>, <1>, . . . , <M> are indices used to identify each of the M LBLs in Col 0, where M is an integer representing the total number of LBLs per column of the memory array 502. A similar notation is used to identify LBLs in other portions of the memory array 502. For example, "Y2-N-<M>" identifies the LBL that is in the Mth position of Col N of Memory Layer 2 of the memory array 502.

The LBLs in a given column share the same FEOL GBL via their respective FEOL pass gate/gain stage blocks 202. For example, LBLs: Y1-0<0>, Y1-0<1> . . . Y1-0<M> in Col 0 share GBL0 via their respective pass gate/gain stage blocks 202 and LBLs: Y1-1<0>, Y1-1<1> . . . Y1-1<M> along Col 1 share GBL1 via their respective pass gate/gain stage blocks 202. Similar associations of LBLs to GBLs are formed in the other columns (e.g., Col 2, Col 3, . . . , Col N) of the memory array 502.

The WLs of each WL layer are apportioned into M BEOL WL Groups: WL Group 0, WL Group 1, . . . , WL Group M. In the exemplary array portion 700 in FIG. 7 it is assumed that there are only two WLs per WL group, in order to simplify illustration, so that each LBL is associated with four memory elements—two from Memory Layer 1 and two from the memory layer above the LBL (e.g., Memory Layer 2). In practice, however, there would typically be many more WLs per WL group and, consequently, many more memory elements 104 associated with each LBL (e.g., hundreds or thousands of memory elements 104 associated with each LBL).

Figure 8:
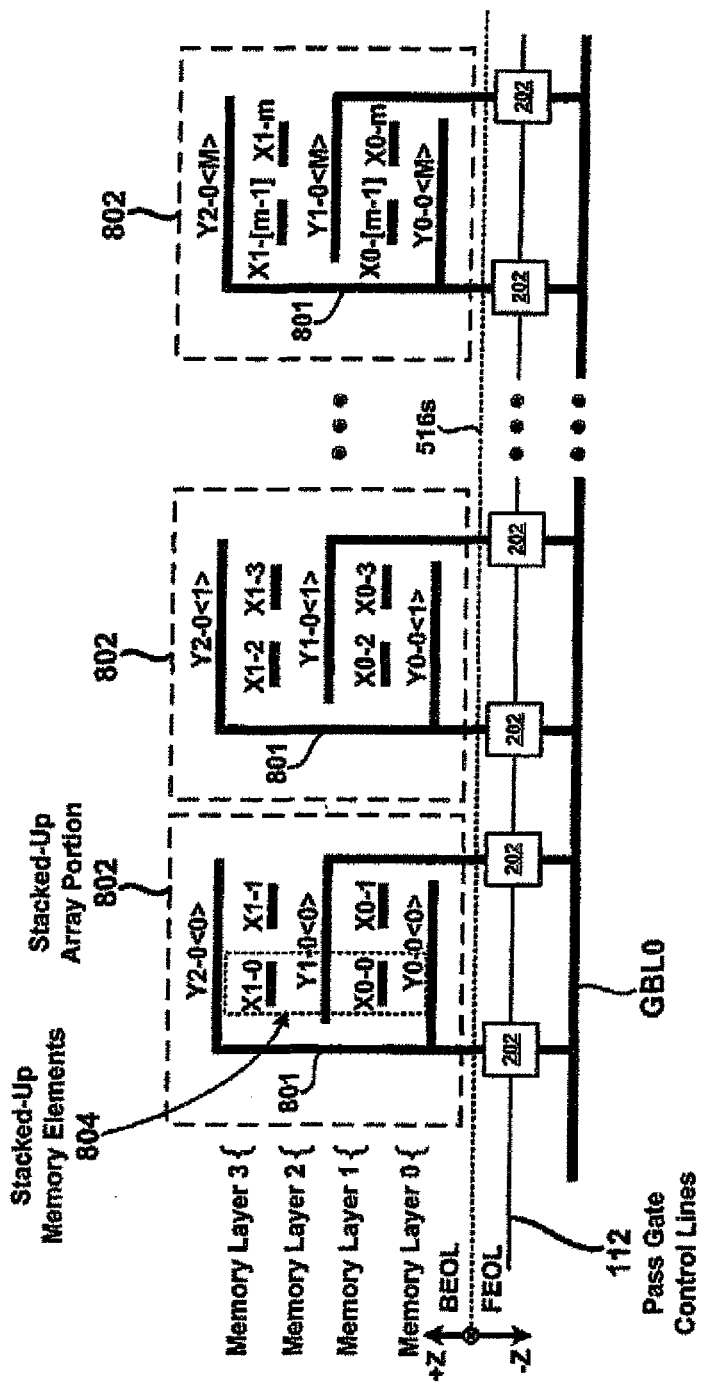
FIG. 8 is a section drawing depicting a modified version of the multi-layer cross-point memory array in FIG. 5 along a plane A-A that cuts through the $0^{th}$ column (e.g., Col 0) in each of memory layers: Memory Layer 0, Memory Layer 1, ..., Memory Layer P of the modified memory array.

In the exemplary multi-layer cross-point memory array 502 described above, the LBLs are confined to independent x-y co-planar LBL Layers: LBL Layer 0, LBL Layer 1, LBL Layer 2. In other embodiments of the invention, the LBLs are configured to also extend further in the +Z-direction so that they span two or more memory layers. For example, in FIG. 8, which is a section view of a modified version of the multi-layer cross-point memory array 502 in FIG. 5 along cutting plane A-A, LBLs from even-numbered LBL layers are electrically coupled with one another, by way of conductive vias 801, so that the LBLs extend in the +Z-direction and span multiple memory layers. (Note that for a memory array having more than four memory layers, the odd-numbered LBL layers would also be electrically coupled with one another.)

Figure 9:
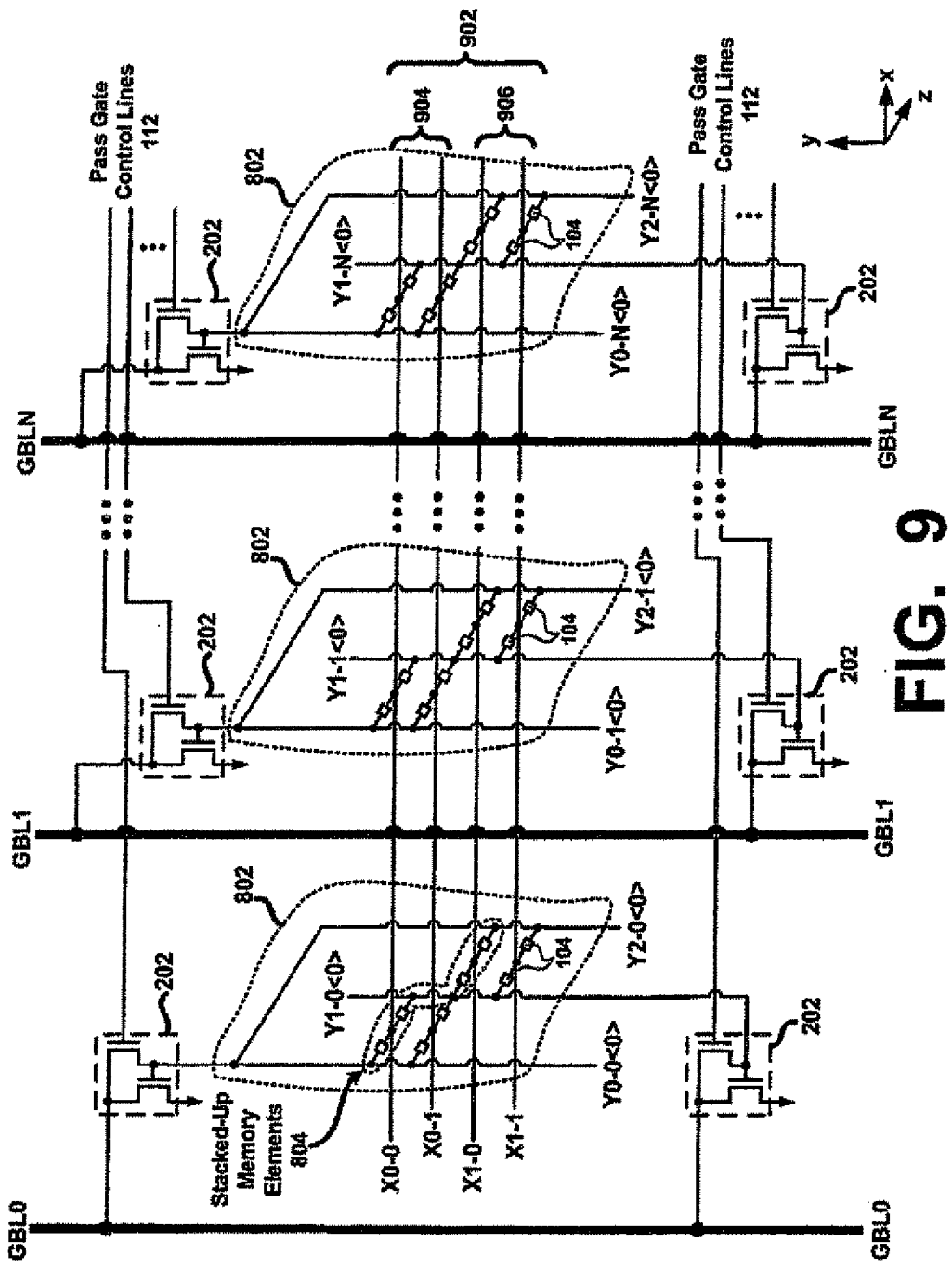
FIG. 9 is a perspective drawing depicting how a plurality of memory array portions are configured along a WL group, according to an embodiment of the present invention.

Spanning LBLs through multiple memory layers results in a multi-layer cross-point memory array having a plurality of "stacked-up" memory array portions 802, each including one or more groups of stacked-up memory elements 804, two or more stacked-up LBLs, and two or more stacked-up WLs. FIG. 9 illustrates how a plurality of these memory array portions 802 are configured along WLs X0-0, X0-1, X1-0 and X1-1, where collectively WLs X0-0, X0-1, X1-0 and X1-1 comprise a WL group 902 (e.g., WL Group 0). WL group 902 includes a first WL subgroup 904 having WLs X0-0 and X0-1 from WL Layer 0 and a second WL subgroup 906 having WLs X1-0 and X1-1 from WL Layer 1. A total of N+1 memory array portions 802 are configured along the WL group 902. The LBLs in even-numbered LBL layers are selectively coupled to their associated GBLs via their respective pass gate/gain stage blocks 202, and the LBLs in odd-numbered LBL layers are selectively coupled to their associated GBLs via their respective pass gate/gain stage blocks 202. For example, LBLs Y0-1<0> and Y2-1<0>, which are electrically coupled with one another to form a spanning LBL in Col 1 of the memory array, are selectively electrically coupled with GBL1 via their respective and common pass gate/gain stage block 202 and LBL Y1-1<0> is selectively coupled to GBL1 via its respective pass gate/gain stage blocks 202.

Figure 10:
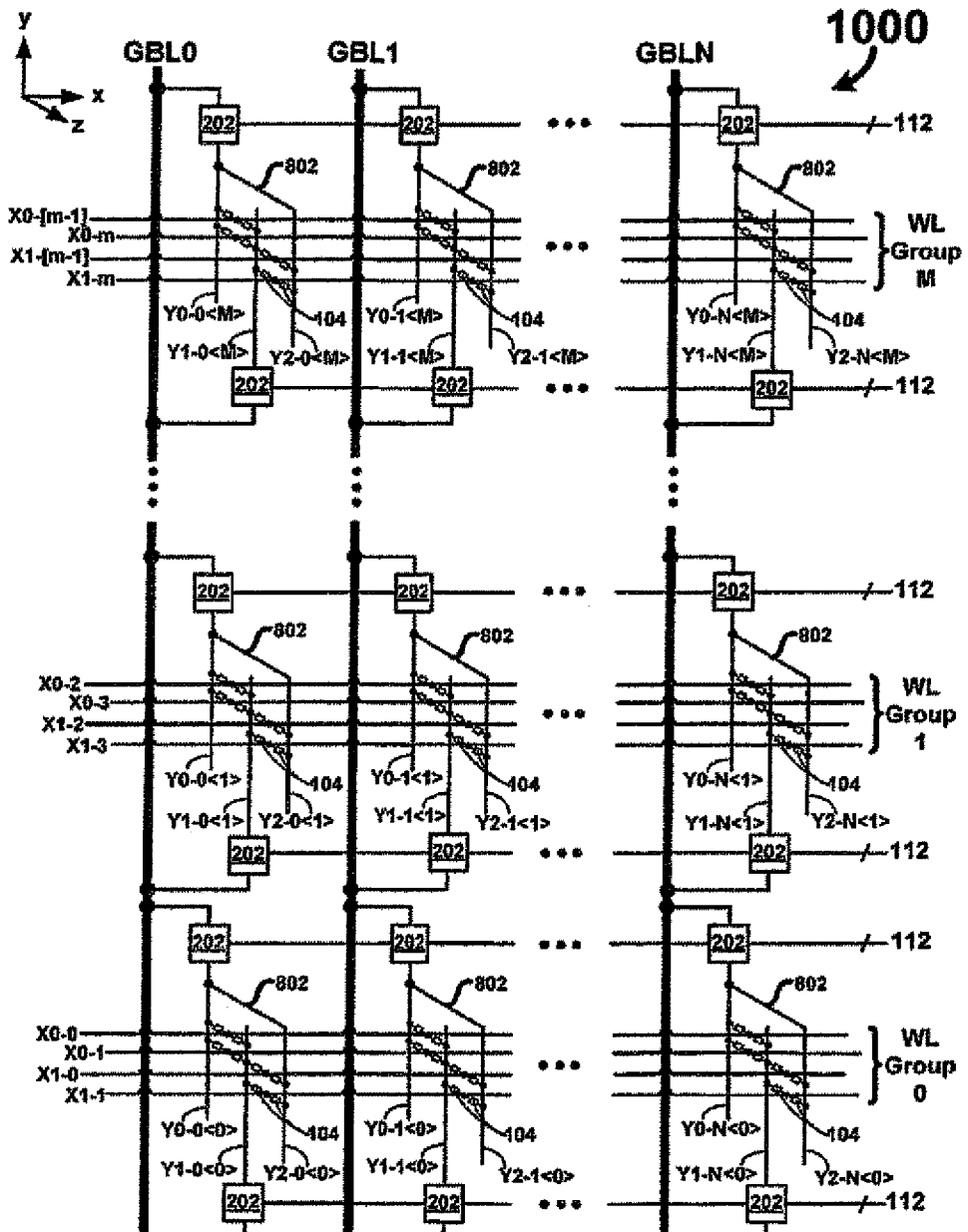
FIG. 10 is a perspective drawing depicting a multi-layer cross-point memory array, according to an embodiment of the present invention.

FIG. 10 is a drawing depicting how a plurality of stacked-up memory array portions 802 are configured to form a complete multi-layer cross-point memory array 1000. The complete multi-layer cross-point memory array 1000 includes N+1 memory array portions 802 per column and M+1 memory array portions 802 associated with the M+1 WL groups. It should be emphasized that, like the other cross-point memory arrays of the present invention, the GBLs and pass gate/gain stage blocks 202 are formed FEOL in a semiconductor substrate or semiconductor epitaxial layer, beneath the BEOL WL, LBL and memory layers of the memory array 1000. (See the FEOL and BEOL description above.)

The memory elements 104 of the memory arrays of the present invention comprise re-writable two-terminal non-volatile devices made from a material capable of storing two or more memory states (e.g., at least 1-bit of data). In one embodiment of the invention, the memory elements 104 comprise discrete, non-volatile, re-writable resistive memory elements made from a conductive metal oxide (CMO) material, such as described in U.S. patent application Ser. No. 11/095, 026, filed Mar. 30, 2005, and published as U.S. Pub. No. 2006/0171200, and entitled "Memory Using Mixed Valence Conductive Oxides", U.S. patent application Ser. No. 12/653, 836, filed Dec. 18, 2009, and published as U.S. Pub. No. 2010/0157658, and entitled "Conductive Metal Oxide Structures In Non-Volatile Re-Writable Memory Devices"; U.S. Patent Application Ser. No. 11/881,496, filed Jul. 26, 2007, now U.S. Pat. No. 7,897,951, and entitled "Continuous Plane Of Thin-Film Materials For A Two-Terminal Cross-Point Memory"; and U.S. patent application Ser. No. 12/653,851, filed Dec. 18, 2009, and published as U.S. Pub. No. 2010/0159641, and entitled "Memory Cell Formation Using Ion Implant Isolated Conductive Metal Oxide", all of which are incorporated herein by reference in their entirety for all purposes. In other embodiments of the invention, the memory elements 104 comprise phase change (e.g., chalcogenide) memory elements, filamentary resistive random-access memory (RRAM) elements, interfacial RRAM elements, magnetoresistive RAM (MRAM), MEMRISTOR memory elements, and programmable metallization cells (e.g., conductive bridging RAM (CBRAM) cells). It should be mentioned, however, that other types of memory elements, whether based on resistive states or on some other memory storing mechanism, whether re-writable or not, and/or whether volatile or non-volatile, may be alternatively used.

Figure 11A:
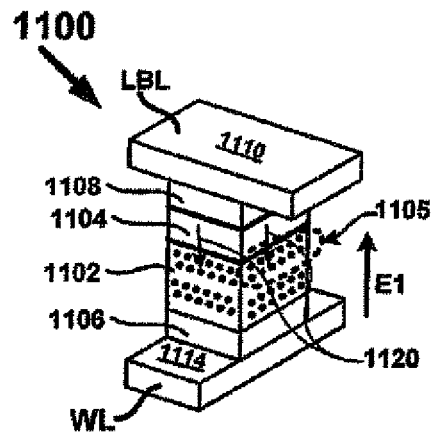
FIGS. 11A and 11B are perspective drawings depicting a conductive metal oxide (CMO) based memory element including mobile oxygen ions which may be used to implement the memory elements of the memory arrays of the present invention, the drawing in FIG. 11A depicting an example of the CMO-based memory element in a low-resistance, erased state and the drawing in FIG. 11B depicting an example of the CMO-based memory element in a high-resistance, programmed state.
Figure 11B:
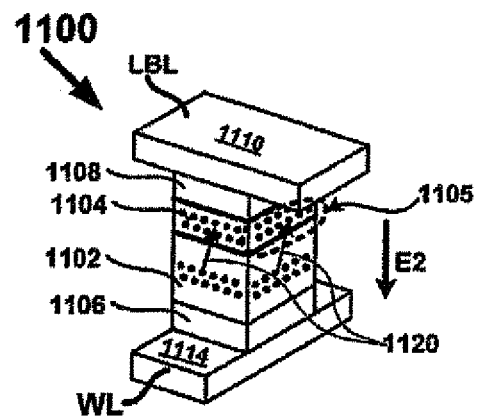

FIGS. 11A and 11B are perspective drawings of one example of a CMO-based memory element 1100 that can be used to implement the memory elements 104 of memory arrays of various embodiments of the present invention. FIG. 11A depicts the CMO-based memory element 1100 in an erased state where mobile oxygen ions 1105 that were previously transported from the CMO 1102 into the IMO 1104 are transported 1120 back into the CMO 1102 to change a conductivity profile of the memory element 1100 to the erased state (e.g., a low resistance state). FIG. 11B depicts the CMO-based memory element 1100 in a programmed state where a portion of the mobile ions 1105 in the CMO 1102 are transported 1120 into the IMO 1104 to change the conductivity profile of the memory element to the programmed state (e.g., a high resistance state). The CMO-based memory element 1100 comprises a multi-layered structure that includes at least one CMO layer 1102 that includes mobile oxygen ions 1105. An insulating metal oxide (IMO) layer 1104 is in contact with the CMO layer 1102. The CMO layer 1102 is electrically coupled with a bottom electrode 1106 and the IMO layer 1104 is electrically coupled with a top electrode 1108 such that the CMO layer 1102 and IMO layer 1104 are electrically in series with each other and with the top and bottom electrodes 1108 and 1106. For example, when configured in one of the memory arrays of the present invention, the bottom electrode 1106 is electrically coupled with one of the WLs 1114 of the memory array and the top electrode 1108 is electrically coupled with one of the LBLs 1110.

The CMO layer 1102 comprises an ionic conductor that is electrically conductive and includes mobile oxygen ions 1105. The material for the CMO layer 1102 has a crystalline structure (e.g., single crystalline or polycrystalline) and the crystalline structure does not change due to data operations on the memory element 1100. For example, read and write operations to the memory element 1100 do not alter the crystalline structure of the CMO layer 1102.

The IMO layer 1104 comprises a high-k dielectric material having a substantially uniform thickness approximately less than 50 Angstroms and is an ionic conductor that is electrically insulating. The IMO layer 1104 is operative as a tunnel barrier that is configured for electron tunneling during data operations on the memory element 1100 and as an electrolyte to the mobile oxygen ions 1105 and is permeable to the mobile oxygen ions 1105 during write operations to the memory element 1100 such that during write operations oxygen ions 1105 are transported 1120 between the CMO and IMO layers 1102 and 1104.

In various embodiments, in regards to the layers 1102 and 1104 of FIGS. 11A-D, the layer 1102 can include one or more layers of a conductive metal oxide material, such as one or more layers of a conductive metal oxide-based ("CMO-based") material, for example. The CMO material is selected for it properties as a variable resistive material that includes mobile oxygen ions and is not selected based on any ferroelectric properties, piezoelectric properties, magnetic properties, superconductive properties, or for any mobile metal ion properties. In various embodiments, layer 1102 can include but is not limited to a manganite material, a perovskite material selected from one or more the following: $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCoO), and $LaSrFeO_x$ (LSFeO), where x is nominally 3 for perovskites (e.g., x≤3 for perovskites) or structure 269 can be a conductive binary oxide structure comprised of a binary metal oxide having the form $A_xO_y$, where A represents a metal and O represents oxygen. The conductive binary oxide material may be doped (e.g., with niobium Nb, fluorine F, and/or nitrogen N) to obtain the desired conductive properties for a CMO.

In various embodiments, layer 1104 can include but is not limited to a material for implementing a tunnel barrier layer and is also an electrolyte that is permeable to the mobile oxygen ions 1105 at voltages for write operations. Suitable materials for the layer 1104 include but are not limited to one or more of the following: high-k dielectric materials, rare earth oxides, rare earth metal oxides, yttria-stabilized zirconium (YSZ), zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$), aluminum oxide (AlOx), silicon oxide (SiOx), and equivalent materials. Typically, the layer 1104 comprises a thin film layer having a substantially uniform thickness of approximately less than 50 Angstroms (e.g., in a range from about 5 Angstroms to about 35 Angstroms).

Figure 11C:
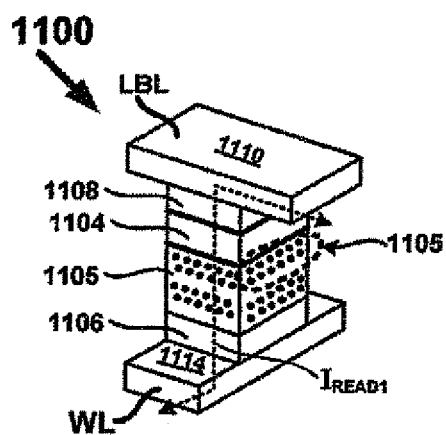
FIGS. 11C and 11D are perspective drawings depicting a CMO-based based memory element in an erased and programmed state respectively, during a read operation where a read voltage is applied across the terminals of the memory element to generate a read current.
Figure 11D:
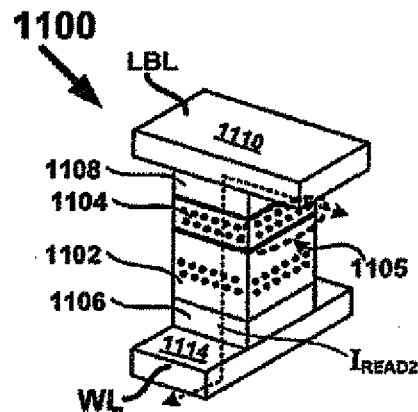

When in an erased state, as depicted in FIG. 11A, mobile oxygen ions 1105 (denoted by the small black-filled circles in FIGS. 11A-D) are concentrated in the CMO layer 1102 and the CMO-based memory element 1100 exhibits a low resistance to current (e.g., is in a low-resistance state). The CMO-based memory element 1100 is programmed to a programmed state (FIG. 11B) by applying a positive voltage across the top and bottom electrodes 1108 and 1106. The applied voltage creates an electric field E2 within the layers 1102 and 1104 that transports 1120 the oxygen ions 1105 from the CMO layer 1102 into the IMO layer 1104, causing the CMO-based memory element 1100 to conform to a high resistance, programmed state. When an erase voltage of reverse polarity is applied across the top and bottom electrodes 1108 and 1106, the mobile oxygen ions 1105 are transported 1120 back into the CMO layer 1102 (FIG. 11A) in response to electric field E1, returning the CMO-based memory element 1100 to a low-resistance, erased state. Writing data to the memory element 1102 does not require a prior erase operation and once data is written to the memory element 1100, the data is retained in the absence of electrical power. Although erase and program voltages have been described as examples of a write operation, writing data to the memory element 1100 requires application of write voltage potentials having an appropriate magnitude and polarity to the terminals of the memory element 1100 (e.g., applied to WL 1114 and LBL 1110 of a selected memory element(s)). In FIGS. 11C and 11D, reading data stored in the memory element 1100 requires application of read voltage potentials having an appropriate magnitude and polarity to the terminals of the memory element 1100 (e.g., applied to WL 1114 and LBL 1110 of a selected memory element(s)). The read voltage is operative to generate a read current $I_{READ}$ that flows through the memory element 1100 while the read voltage is applied. The magnitude of the read voltage and the resistive value of the data stored in the selected memory element 1100 determine the magnitude of the read current $I_{READ}$. In FIG. 11C, the memory element 1100 is depicted in the erased state (e.g., low resistance state) and in FIG. 11D the memory element 1100 is depicted in the programmed state (e.g., high resistance state). Therefore, given the same magnitude of read voltage (e.g., 1.5V), the read current $I_{READ1}$ will have a higher magnitude (e.g., due to the lower resistance state) depicted in FIG. 11C than the read current $I_{READ2}$ depicted in FIG. 11D due to the higher resistance of the programmed state (i.e., $I_{READ1} > I_{READ2}$). Application of the read voltage does not cause mobile oxygen ion 1105 transport 1120 because the magnitude of the read voltage is less than the magnitude of the write voltage and therefore the read voltage does not generate an electric field having sufficient magnitude to cause mobile oxygen ion 1105 transport 1120 during read operations. Therefore, it is not necessary to re-write the data stored in the memory element 1100 after a read operation because the read operation is non-destructive to the stored data (e.g., does not corrupt or significantly disturb the stored data).

Once the CMO-based memory element 1100 is programmed or erased to either state, the memory element 1100 maintains that state even in the absence of electrical power. In other words, the CMO-based memory element 1100 is a non-volatile memory element. Therefore, no battery backup or other power source, such as a capacitor or the like, is required to retain stored data. The two resistive states are used to represent two non-volatile memory states, e.g., logic "0" and logic "1." In addition to being non-volatile, the CMO-based memory element 1100 is re-writable since it can be programmed and erased over and over again. These advantages along with the advantage of being able to stack the two-terminal CMO-based memory elements in one or more memory layers above FEOL semiconductor process layers, are some of the advantages that make the CMO-based memory arrays of the present invention a viable and competitive alternative to other non-volatile memory technologies such as Flash memory. In other embodiments, the memory element 1100 stores two or more bits of non-volatile data (e.g., MLC) that are representative of more than two logic states such as: "00"; "01"; "10"; and "11", for example. Those logic states can represent a hard-programmed state "00", a soft-programmed state "01", a soft-erased state "10", and a hard-erased state "11", and their associated conductivity values (e.g., resistive states). Different magnitudes and polarities of the write voltage applied in one or more pulses that can have varying pulse shapes and durations can be used to perform write operations on the memory element 1100 configured for SLC and/or MLC.

Figure 11E:
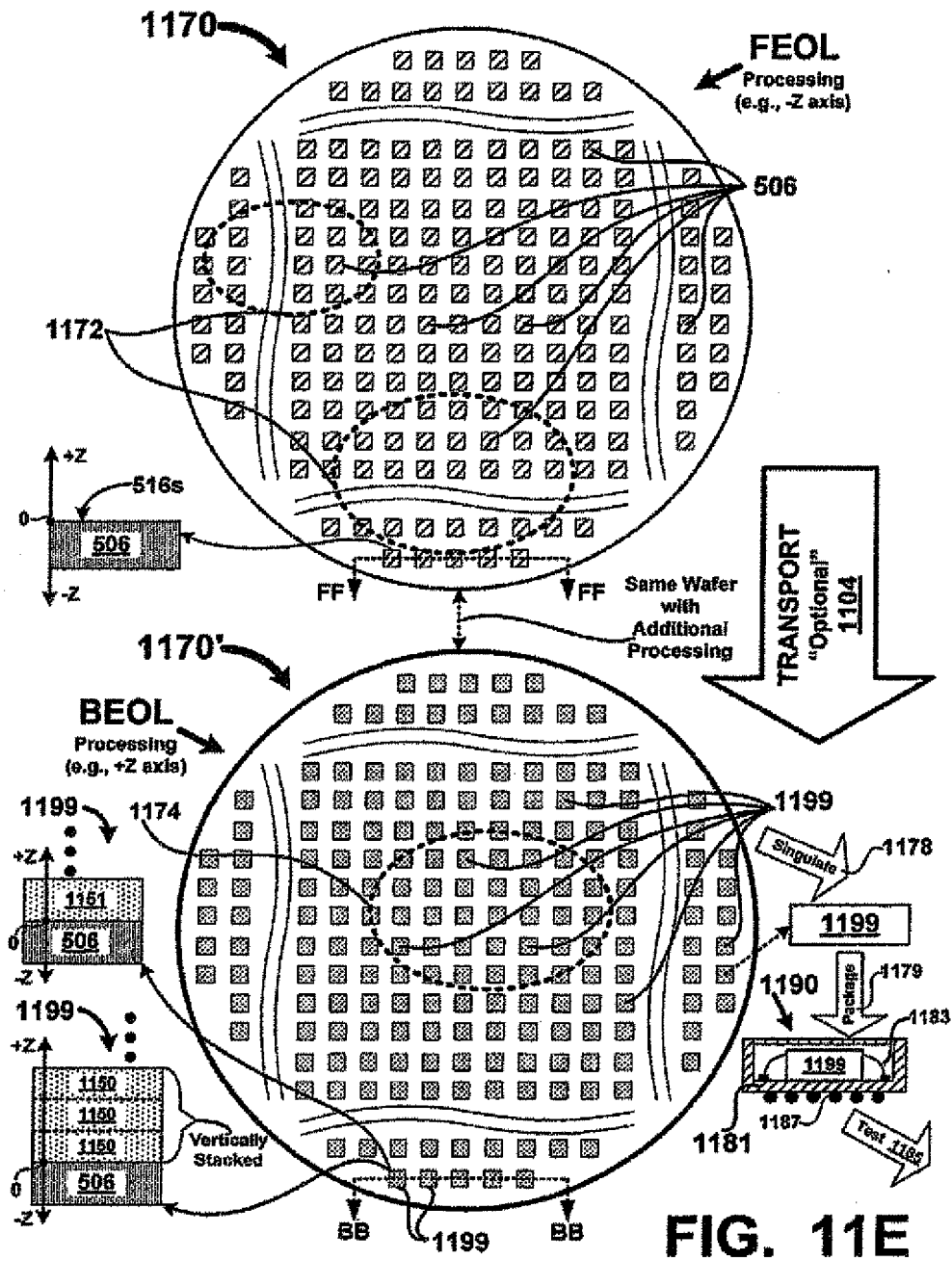
FIG. 11E depicts top plan views of a wafer processed FEOL to form a plurality of base layer die including active circuitry and an electrical interconnect structure and the same wafer subsequently processed BEOL to integrally form one layer or multiple layers of memory and their respective memory elements directly on top of the base layer die where the finished die can subsequently be singulated, tested, and packaged into integrated circuits.

FIG. 11E is a top plan view depicting a single wafer (denoted as 1170 and 1170') at two different stages of fabrication on the same wafer: FEOL processing on the wafer denoted as 1170 during the FEOL stage of microelectronics processing where active circuitry (e.g., CMOS circuitry) in logic layer 508 is fabricated on the substrate that comprises base layer die 506 (e.g., a silicon wafer); followed by BEOL processing on the same wafer denoted as 1170' during the BEOL stage of microelectronics processing where one or more layers (e.g., 1151 or 1150) of BEOL non-volatile memory are fabricated directly on top of the FEOL logic layer 508 (e.g., on an upper surface 516s of the FEOL interlayer interconnect structure). The single layer 1151 or multiple vertically stacked layers 1150 are not glued, soldered, wafer bonded, or otherwise physically or electrically connected with the base layer die 506, instead they are grown directly on top of the base layer die 506 so that they are integrally connected with the base layer die 506 and with one another, are electrically coupled with the circuitry in the FEOL logic layer 508, thereby forming a unitary integrated circuit die 1199 that includes monolithically integrated FEOL and BEOL portions (e.g., inseparable FEOL circuitry and BEOL memory portions). Wafer 1170 includes a plurality of the base layer die 506 (see 506 in FIGS. 5-6) formed individually on wafer 1170 as part of the FEOL process. As part of the FEOL processing, the base layer die 506 may be tested 1172 to determine their electrical characteristics, functionality, yield, performance grading, etc. After all FEOL processes have been completed, the wafer 1170 is optionally transported 1104 for subsequent BEOL processing (e.g., adding one or more layers of memory such as single layer 1151 or multiple layers 1150) directly on top of each base layer die 506. A base layer die 506 is depicted in cross-sectional view along a dashed line FF-FF where a substrate (e.g., a silicon Si wafer) for the die 506 and its associated active circuitry in logic layer 508 have been previously fabricated FEOL and are positioned along the −Z axis. For example, the one or more layers of memory (e.g., 1151 or 1150) are grown directly on top of an upper surface 516s of each base layer die 506 as part of the subsequent BEOL processing. Upper layer 516s can be an upper planar surface of the aforementioned interlayer interconnect structure operative as a foundation for subsequent BEOL fabrication of the memory layers along the +Z axis.

During BEOL processing the wafer 1170 is denoted as wafer 1170', which is the same wafer subjected to additional processing to fabricate the memory layer(s) and their associated memory elements directly on top of the base layer die 506. Base layer die 506 that failed testing may be identified either visually (e.g., by marking) or electronically (e.g., in a file, database, email, etc.) and communicated to the BEOL fabricator and/or fabrication facility. Similarly, performance graded base layer die 506 (e.g., graded as to frequency of operation) may identified and communicated to BEOL the fabricator and/or fabrication facility. In some applications the FEOL and BEOL processing can be implemented by the same fabricator or performed at the same fabrication facility. Accordingly, the transport 1104 may not be necessary and the wafer 1170 can continue to be processed as the wafer 1170'. The BEOL process forms the aforementioned memory elements and memory layer(s) directly on top of the base layer die 506 to form a finished die 1199 that includes the FEOL circuitry portion 508 along the −Z axis and the BEOL memory portion along the +Z axis. For example, the memory elements (e.g., 104, 304, 1100, or 1202) and their associated WLs and LBLs can be fabricated during the BEOL processing. The types of memory elements that can be fabricated BEOL are not limited to those described herein and the materials for the memory elements are not limited to the memory element materials described herein. A cross-sectional view along a dashed line BB-BB depicts a memory device die 1199 with a single layer of memory 1151 grown (e.g., fabricated) directly on top of base die 506 along the +Z axis, and alternatively, another memory device die 1199 with three vertically stacked layers of memory 1150 grown (e.g., fabricated) directly on top of base die 506 along the +Z. Finished die 1199 on wafer 1170' may be tested 1174 and good and/or bad die identified. Subsequently, the wafer 1170' can be singulated 1178 to remove die 1199 (e.g., die 1199 are precision cut or sawed from wafer 1170') to form individual memory device die 1199. The singulated die 1199 may subsequently be packaged 1179 to form an integrated circuit chip 1190 for mounting to a PC board or the like, as a component in an electrical system (not shown) that electrically accesses IC 1190 to perform data operations on BEOL memory. Here a package 1181 can include an interconnect structure 1187 (e.g., pins, solder balls, or solder bumps) and the die 1199 mounted in the package 1181 and electrically coupled 1183 with the interconnect structure 1187 (e.g., using wire bonding or soldering). The integrated circuits 1190 (IC 1190 hereinafter) may undergo additional testing 1185 to ensure functionality and yield. The die 1199 or the IC 1190 can be used in any system requiring non-volatile memory and can be used to emulate a variety of memory types including but not limited to SRAM, DRAM, ROM, and Flash. Unlike conventional Flash non-volatile memory, the die 1199 and/or the IC's 1190 do not require an erase operation or a block erase operation prior to a write operation so the latency associated with conventional Flash memory erase operations is eliminated and the latency associated with Flash OS and/or Flash file system required for managing the erase operation is eliminated. Random access data operations to the die 1199 and/or the IC's 1190 can be implemented with a granularity of 1-bit (e.g., a single memory element) or more (e.g., a page or block of memory elements). Moreover, a battery back-up power source or other AC or DC power source is not required to retain data stored in the memory elements embedded in each memory layer (1151 or 1150) because the memory is non-volatile and retains stored data in the absence of electrical power. Another application for the IC's 1190 is as a replacement for conventional Flash-based non-volatile memory in embedded memory, solid state drives (SSD's), hard disc drives (HDD's), or cache memory, for example.

Figure 11F:
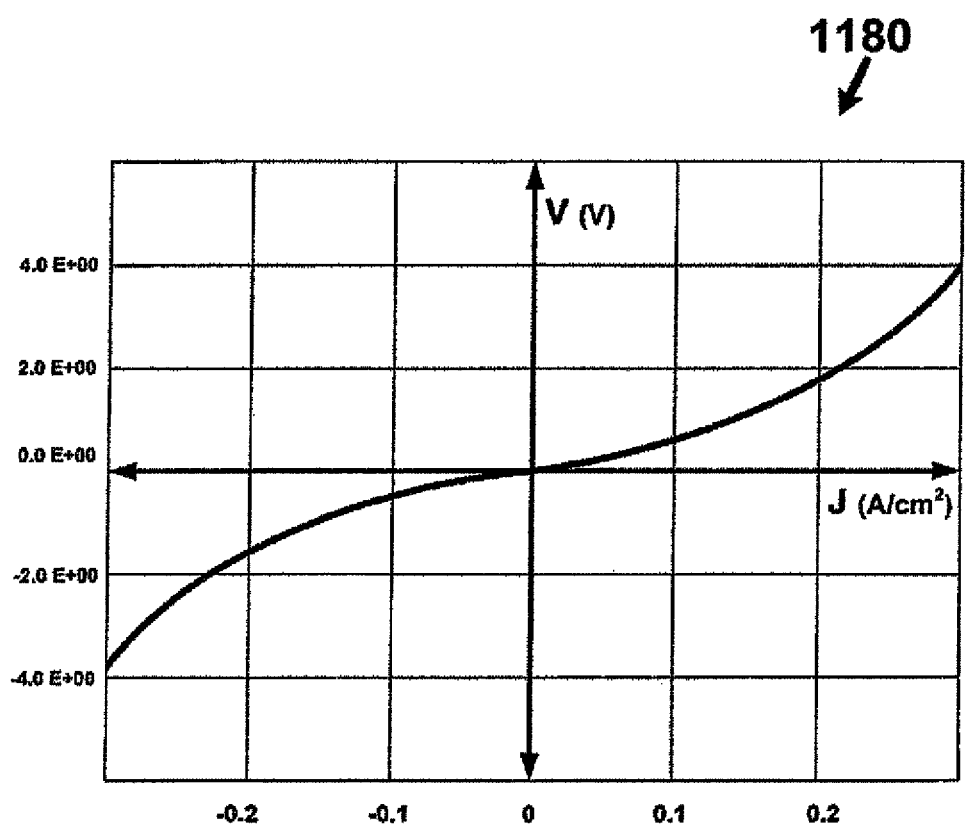
FIG. 11F depicts a graphical representation of an example of a non-linear I-V characteristic for a discrete memory element with integral selectivity.

FIG. 11F graphically depicts one example of a non-linear I-V characteristic 1180 for a discrete re-writeable non-volatile two-terminal resistive memory element (e.g., the memory element 104, 304, 804, 1100 of FIGS. 1, 2, 3, 5, 7, 9, 10, 11A-11D, 12, and 14-15) having integral selectivity due to its non-linear I-V characteristics and the non-linear I-V characteristic is maintained regardless of the value of the data stored in the memory cell, that is the I-V characteristic of the memory element does not change from non-linear to linear as a function of the resistive state stored in the memory element. Therefore, the non-linear I-V characteristic of the memory element is non-linear for all values of stored data (e.g., resistive states). Voltage V applied across the memory element is plotted on the Y-axis and current density J through the memory element is plotted on the X-axis. Here, current through the memory element is a non-linear function of the applied voltage across the memory element. Accordingly, when voltages for data operations (e.g., read and write voltages) are applied across the memory element, current flow through the memory element does not significantly increase until after a voltage magnitude of about 2.0V (e.g., at ≈0.2 A/cm$^2$) is reached (e.g., a read voltage of about 2.0V across the memory element). An approximate doubling of the voltage magnitude to about 4.0V does not double the current flow and results in a current flow of ≈0.3 A/cm$^2$. The graph depicted is only an example and actual non-linear I-V characteristics will be application dependent and will depend on factors including but not limited to an area of the memory element (e.g., area determines the current density J) and the thin-film materials used in the memory element, just to name a few. The area of the memory element will be application dependent. Here, the non-linear I-V characteristic of the discrete memory element applies to both positive and negative values of applied voltage as depicted by the non-linear I-V curves in the two quadrants of the non-linear I-V characteristic 1180.

One advantage of a discrete re-writeable non-volatile two-terminal resistive memory element that has integral selectivity due to a non-linear I-V characteristic is that when the memory element is half-selected (e.g., one-half of the magnitude of a read voltage or a write voltage is applied across the memory element) during a data operation to a selected memory cell(s), the non-linear I-V characteristic is operative as an integral quasi-selection device and current flow through the memory element is reduced compared to a memory cell with a linear I-V characteristic. Therefore, a non-linear I-V characteristic can reduce data disturbs to the value of the resistive state stored in the memory element when the memory element is un-selected or is half-selected.

FIGS. 12-15 are drawings illustrating how a memory element 1202 in a memory array section 1200 may be read, programmed and erased. In the description of FIGS. 12-15 that follows, the memory element 1202 is referred to as the "selected" memory element 1202, to emphasize that it is the memory element that is being read from or written to. A memory element that has only one of its terminals electrically coupled with a selected WL or selected LBL during a read, program or erase operation of the selected memory element 1202 is referred to as a "half-selected" memory element. And a memory element that has neither of its terminals electrically coupled with a selected WL or selected LBL during a read, program or erase operation of the selected memory element 1202 is referred to as an "unselected" memory element. It should be emphasized that, whereas FIGS. 12-15 and accompanying description demonstrate how data may be read, programmed and erased on a bit basis, nibbles, bytes, words or higher-bit group of data may also or alternatively be read, programmed or erased simultaneously in a single read, program or erase operation.

Figure 12:
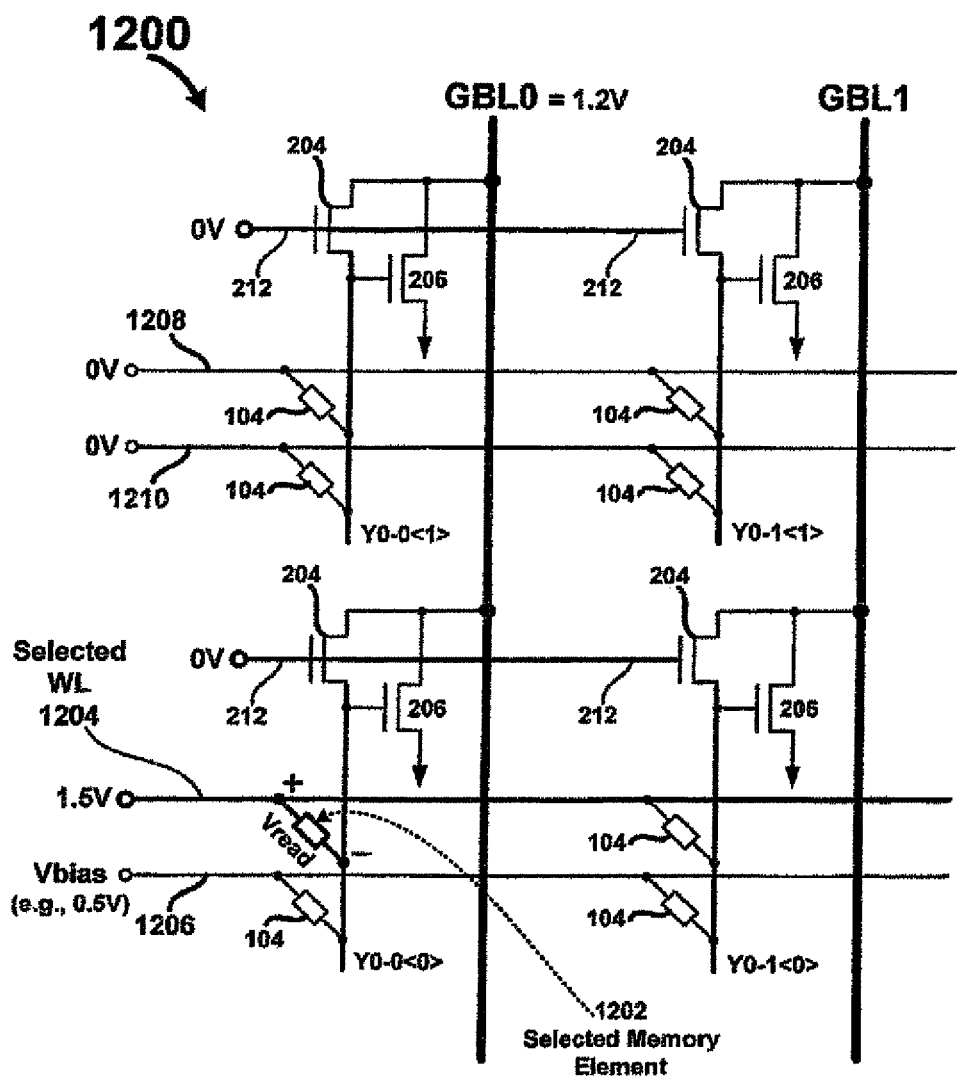
FIG. 12 is a schematic drawing depicting a section of a memory array of the present invention, illustrating one example of how a selected memory element is read during a read operation.

FIG. 12 illustrates how the selected memory element 1202 is read during a read operation. In preparation for the read operation, all of the pass gate transistors 204 of the LBLs are turned off by applying a pass gate voltage (e.g., 0V or less) to the gates of the pass gate transistors 204. The LBL associated with the selected memory element 1202 (e.g., LBL Y0-0<0>) is then discharged and biased to a bias voltage Vbias through all the memory elements 104 on the rows (i.e., WLs) associated with the LBL Y0-0<0>. Vbias is set to have a value greater than or equal to the threshold voltage Vt of the gain stage transistor 206 of LBL Y0-0<0>, so that the gain stage transistor 206 of LBL Y0-0<0> remains in its desired operating range during the read operation. In one embodiment of the invention, Vbias can be generated from a transistor-based reference that tracks variations in a threshold voltage Vt, such as may occur due to process, voltage and temperature variations, for example, and is capacitively coupled to LBL Y0-0<0> and the gate of its gain stage transistor 206 via one of the un-selected or half-selected WLs, such as half-selected WL 1206 in FIG. 12.

After or before LBL Y0-0<0> is biased to Vbias, the GBL associated with the selected memory element 1202 (e.g., GBL0) is precharged to some predetermined positive voltage (e.g., 1.2V) and is then allowed to float. After GBL0 has been precharged, a voltage Vread+Vbias (e.g., 1.5V) is applied to the selected WL 1204 and an unselect voltage (e.g., 0V) is applied to unselected WLs 1208 and 1210. The applied voltage results in the read voltage Vread being dropped across the selected memory element 1202, causing current to pass through the selected memory element 1202 and charge the capacitance on LBL Y0-0<0>. As the LBL capacitance charges up, a voltage VlbI develops on LBL Y0-0<0> that increases toward a final value of Vread+Vbias. As the voltage VlbI on LBL Y0-0<0> increases, the capacitance CgbI0 of GBL0 discharges through the gain stage transistor 206, and the voltage VgbI0 on GBL0 decreases from its precharged level at an approximate rate of: $dVgbI0/dt = k(VlbI-Vt)^2/CgbI0$, where k is a process constant of the gain stage transistor 206.

Figure 13:
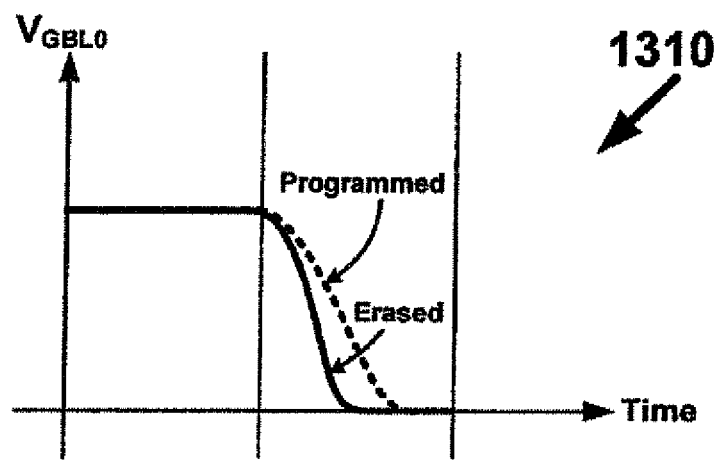
FIG. 13 is a drawing depicting the voltages VgbI0 and VIbI on GBL0 and LBL Y0-0<0> versus time during a read operation.
Figure 13:
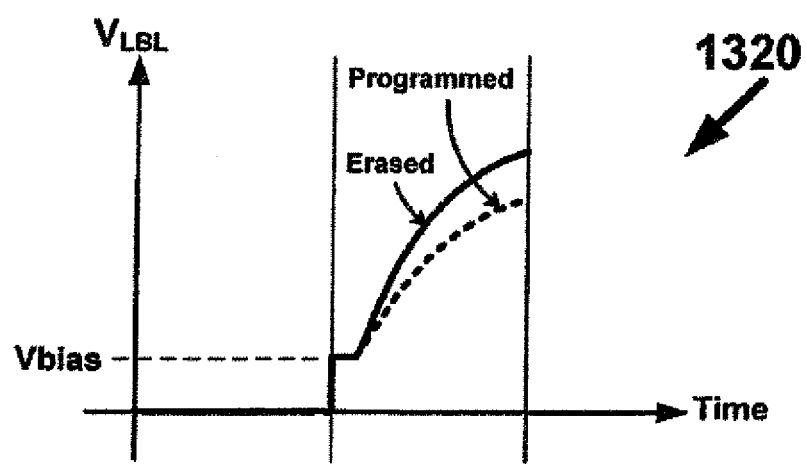

The charging of LBL Y0-0<0> and discharging of GBL0 during the read operation result in the voltage versus time profiles shown in FIG. 13. The voltage VgbI0 on GBL0 decreases more rapidly (see profile 1310) and the voltage VlbI on LBL Y0-0<0> increases more rapidly (see profile 1320) if the selected memory element 1202 is in a low-resistance state compared to if in a high-resistance state. This difference in voltage profiles allow a sense amplifier or other measuring circuit to determine whether the selected memory element 1202 is in an erased state or in a programmed state and, therefore, whether the selected memory element 1202 is storing a logic "0" or a logic "1".

Using the pass gate 204 and gain stage transistor 206 in the manner described above affords the ability to read the selected memory element 1202 in a short period of time. By turning the pass gate 204 of LBL Y0-0<0> off during the read operation, LBL Y0-0<0> is isolated from GBL0. This allows LBL Y0-0<0> to charge up faster than it could if it were electrically coupled with GBL0, since with the pass gate 204 off, the charge-up time of LBL Y0-0<0> is independent of the capacitance CgbI0 of GBL0. The gain stage transistor 206 also helps to achieve a fast read speed since it operates as a voltage amplifier, amplifying the voltage on local bit line which is a result of current flow through the memory element 1202, which may be on the order of a nanoampere, to a much higher current (perhaps on the order of a microampere) on GBL0. The higher current allows the capacitance CgbI0 of GBL0 to discharge at a fast rate, thereby allowing the selected memory element 1202 to be read in a short period of time.

Figure 14:
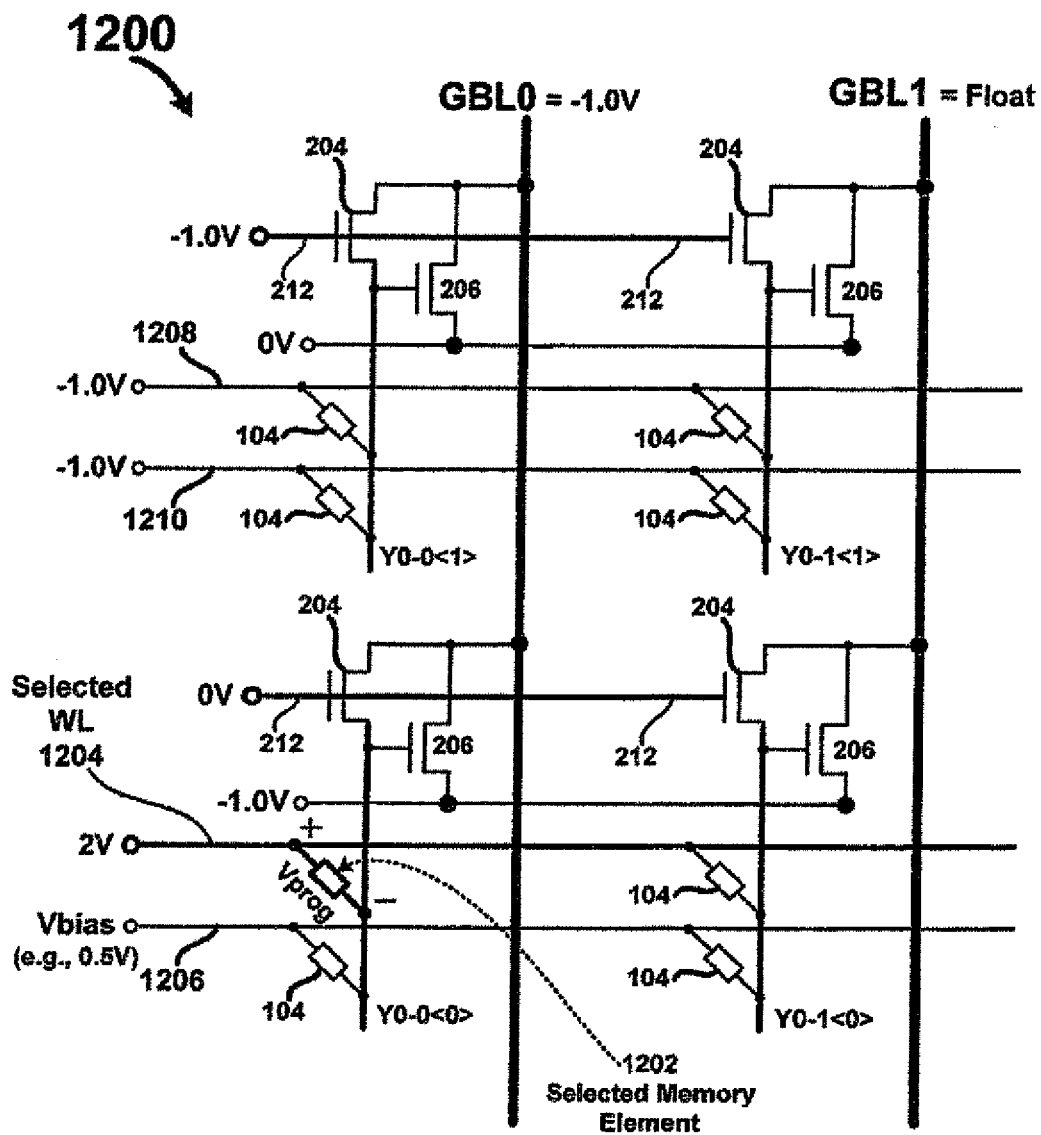
FIG. 14 is a schematic drawing depicting a section of a memory array of the present invention, illustrating one example of how a selected memory element is programmed during a program operation.

FIG. 14 illustrates how the selected memory element 1202 is programmed during a program operation. GBL0 is first pre-charged to some predetermined negative voltage VgbI0 (e.g., −1V) and GBL1 is allowed to float. The pass gates 204 of the LBLs associated with the unselected WLs 1208 and 1210 (e.g., the pass gates 204 associated with LBLs Y0-0<1> and Y0-1<1>) are then turned off by applying an off voltage (e.g., −1V) to their gates. An unselect voltage (e.g., −1V) is applied to unselected WLs 1208 and 1210. This voltage is also coupled to the gates of the gain stage transistors 206 associated with the unselected WLs 1208 and 1210, ensuring that the gain stage transistors 206 associated with the unselected WLs 1208 and 1210 remain disabled during the program operation.

The gain stage transistor 206 of LBL Y0-0<0> is also disabled by biasing the gate and source of the gain stage transistor 206 so that its gate-to-source voltage always remains below Vt during the program operation. A voltage signal comprising one or more pulses (e.g., one or more +2V pulses) is then applied to the selected WL 1204 and one terminal of the selected memory element 1202. Because the pass gate 204 of LBL Y0-0<0> is on, the voltage VgbI0 on GBL0 is passed through the pass gate to the other terminal of the selected memory element 1202. This results in a series of program voltage pulses Vprog (+3V pulses in this example) being dropped across the selected memory element 1202. In embodiments of the invention in which a CMO-based memory element is used to implement the memory elements 104, the Vprog pulses create a pulsed electric field (e.g., E2) that forces at least a portion of the mobile oxygen ions 1105 from the memory element's CMO layer 1102 into the memory element's IMO layer 1104 and causes the CMO-based memory element 1202 to conform to a high-resistance, programmed state, as was explained above in reference to FIGS. 11A and 11B. Following the program operation, a read operation, like that described above, can optionally be performed to verify that the selected memory element has been programmed to the desired high-resistance state. If the read operation determines that the selected memory element 1202 has not been fully programmed, the program operation can be repeated until the desired high-resistance, program state is achieved.

Figure 15:
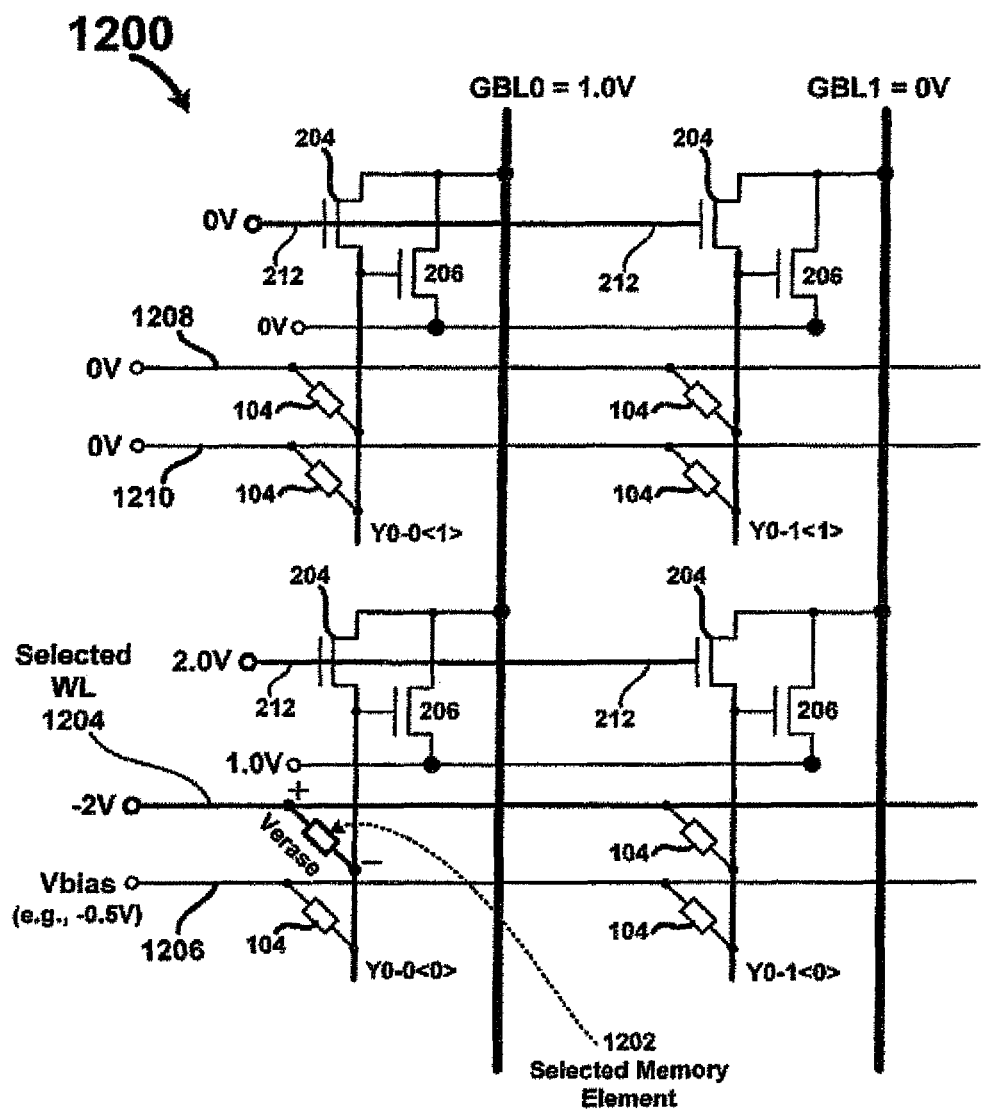
FIG. 15 is a schematic drawing depicting a section of a memory array of the present invention, illustrating one example of how a selected memory element is erased during an erase operation.

Finally, FIG. 15 shows the array portion 1200 and selected memory element 1202 during an erase operation. The erase operation is similar to the program operation, except that the voltage pulses applied across the selected memory element 1202 are of a reverse polarity. GBL0 is precharged to a positive voltage VgbI0 (e.g., 1V). An unselect voltage (e.g., 0V) is applied to unselected WLs 1208 and 1210. This voltage is also coupled to the gates of the gain stage transistors 206 associated with the unselected WLs 1208 and 1210, ensuring that the gain stage transistors 206 associated with the unselected WLs 1208 and 1210 remain disabled during the erase operation. The pass gates 204 of the LBLs associated with the unselected WLs 1208 and 1210 (e.g., the pass gates 204 associated with LBLs Y0-0<1> and Y0-1<1>) are also turned off by applying an off voltage (e.g., 0V) to their gates.

The gain stage transistor 206 of LBL Y0-0<0> is disabled by biasing the gate and source of the gain stage transistor 206 so that its gate-to-source voltage always remains below Vt during the erase operation. A voltage signal comprising one or more pulses (e.g., one or more −2V pulses) is applied to the selected WL 1204 and one terminal of the selected memory element 1202. Because the pass gate 204 of LBL Y0-0<0> is turned on, the voltage VgbI0 on GBL0 is passed through the pass gate 204 to the other terminal of the selected memory element 1202. This results in a series of voltage pulses Verase (−3V pulses in this example) being dropped across the selected memory element 1202. In embodiments of the invention in which a CMO-based memory element is used to implement the memory elements 104, the Verase pulses create a pulsed electric field (e.g., E1) that forces the portion of mobile oxygen ions 1105 from the memory element's IMO layer 1104 into the memory element's CMO layer 1102 and causes the CMO-based memory element 1202 to conform to a low-resistance, erased state. Following the erase operation, a read operation, like that describe above, can optionally be performed to verify that the selected memory element 1202 has been erased to the desired low-resistance state. If the read operation determines that the selected memory element 1202 has not been fully erased, the erase operation can be repeated until the desired low-resistance, erase state is achieved.

COMPENSATING FOR PROCESS, OPERATING VOLTAGE, AND TEMPERATURE VARIATIONS

Figure 2:
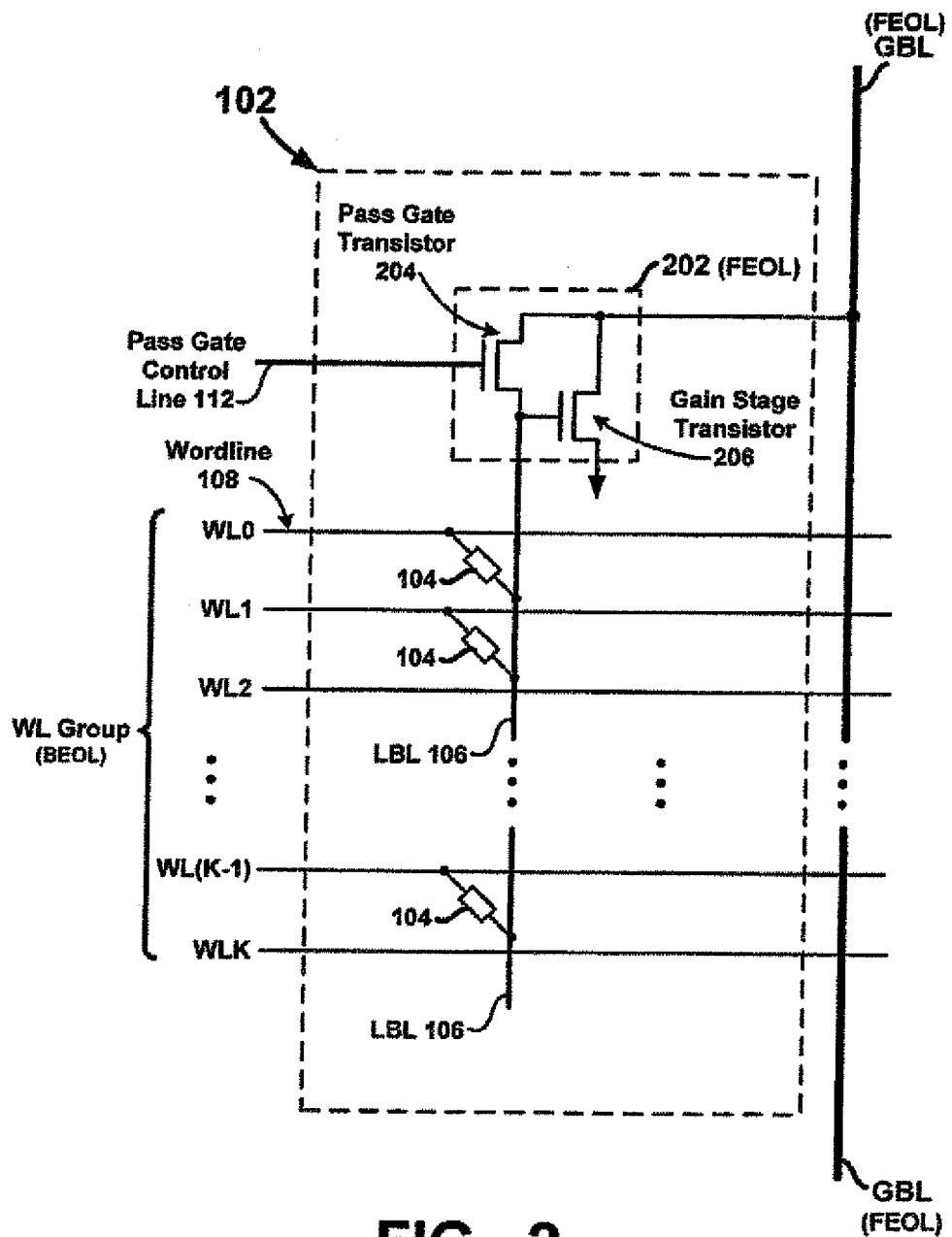
FIG. 2 is a schematic drawing depicting a memory array portion of the memory array depicted in FIG. 1.

Process, operating temperature, and temperature (PVT) variations can cause uncertainties in sense timing and sense margin of a read operation. Referring to FIG. 2, the speed and magnitude at which the GBL discharges is dependent on both the current capability of the gain stage transistor 206, the signal generated on the local bit line (LBL 106), and the current capability of the pass gate/gain stage block 202. If the pass gate/gain stage block 202 conducts a fixed amount of current regardless of the current capability of the gain stage transistor 206, the speed and magnitude at which the GBL discharges may be unpredictable.

Figure 16:
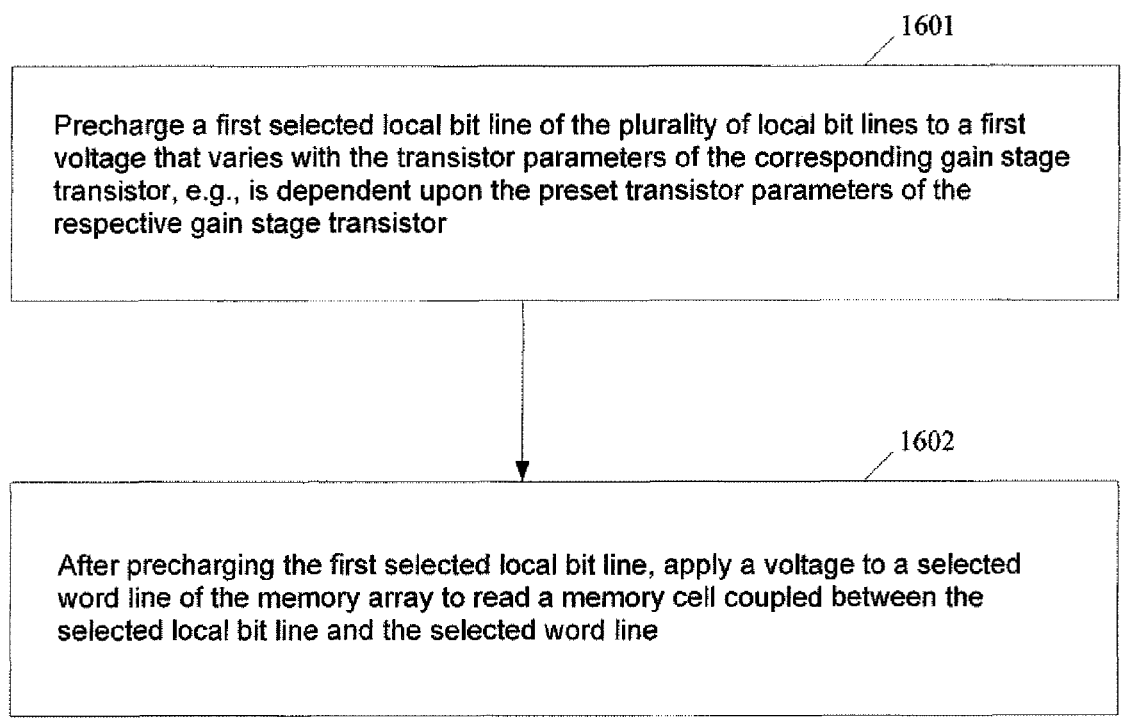
FIG. 16 is a flow chart illustrating an example process for compensating for process, operating voltage, and temperature variations in the memory array of FIG. 1.

In order to improve the operating margin of the memory array of FIG. 1, the global bit line and/or the selected local bit line can be biased by the sense and control circuitry 402 (FIG. 4) to compensate for the PVT variation. FIG. 16 is a flow chart illustrating an example process for compensating for process, operating voltage, and temperature variations in the memory array of FIG. 1.

In block 1601, a selected local bit line, e.g., LBL 106 (FIG. 2), of a plurality of local bit lines is precharged to a voltage that varies with the preset transistor parameters of the respective gain stage transistor, e.g., gain stage transistor 206 (FIG. 2), of a plurality of gain stage transistors. It should be appreciated that the gain stage transistor 206 (FIG. 2) has, e.g., a particular voltage threshold that, due to PVT variation, may be different than a particular voltage threshold of another one of the gain stage transistors of the memory array and that may differ from time to time during array operation. The selected local bit line is precharged to a voltage that corresponds, e.g., with the particular voltage threshold of the one of the gain stage transistors of the memory array that corresponds to the selected local bit line, at a time that the read is to be performed.

Another selected local bit line of the plurality of local bit lines may be, coincident with precharging the first selected local bit line, precharged to a different voltage that, e.g., corresponds with a voltage threshold of a different gain stage transistor of the plurality of gain stage transistors. The resulting precharge voltages of the two selected local bit lines may be different values.

In an example, a write transistor of the memory array, e.g., pass gate transistor 204 (FIG. 2), is activated to short the selected local bit line to its corresponding global bit line. Responsive to said shorting, a preset current is applied to the global bit line to bias the gain stage transistor 206 (FIG. 2) to, e.g., a voltage that corresponds with the gain stage transistor voltage threshold. In an example, a value of the preset current is in correspondence with a value of a read current associated with a memory cell to be accessed via the selected local bit line, e.g., one of the memory elements 10.

In an example, a word line that corresponds to the selected local bit line is floated at a time that the preset current is applied in order to precharge the selected local bit line to the percharge voltage. For example, the word lines WL0-WLK may be floated in order to precharge LBL 106.

In block 1602, after the precharge, a voltage is applied to a word line of the memory array, e.g., a word line of the word lines WL0-WLK, to read a memory cell, e.g., one of the memory elements 104.

In an example, after applying the preset current to the global bit line, the write transistor is deactivated to trap a charge on the selected local bit line. In an example, after deactivating the write transistor, the global bit line is precharged with a voltage that coincides with the read voltage associated with the memory cell.

In an example, another memory array write transistor, which also couples to the selected global bit line, is held inactive while the selected write transistor is activated. For example, referring to FIG. 1, the pass gate transistors coupled to all but the topmost pass gate control line 112 are held inactive while the topmost pass gate control line 112 is asserted.

It should be appreciated that the processes described above may be implemented by using a controller coupled to the memory array (and components thereof), e.g., as shown in FIG. 4.

Figure 17:
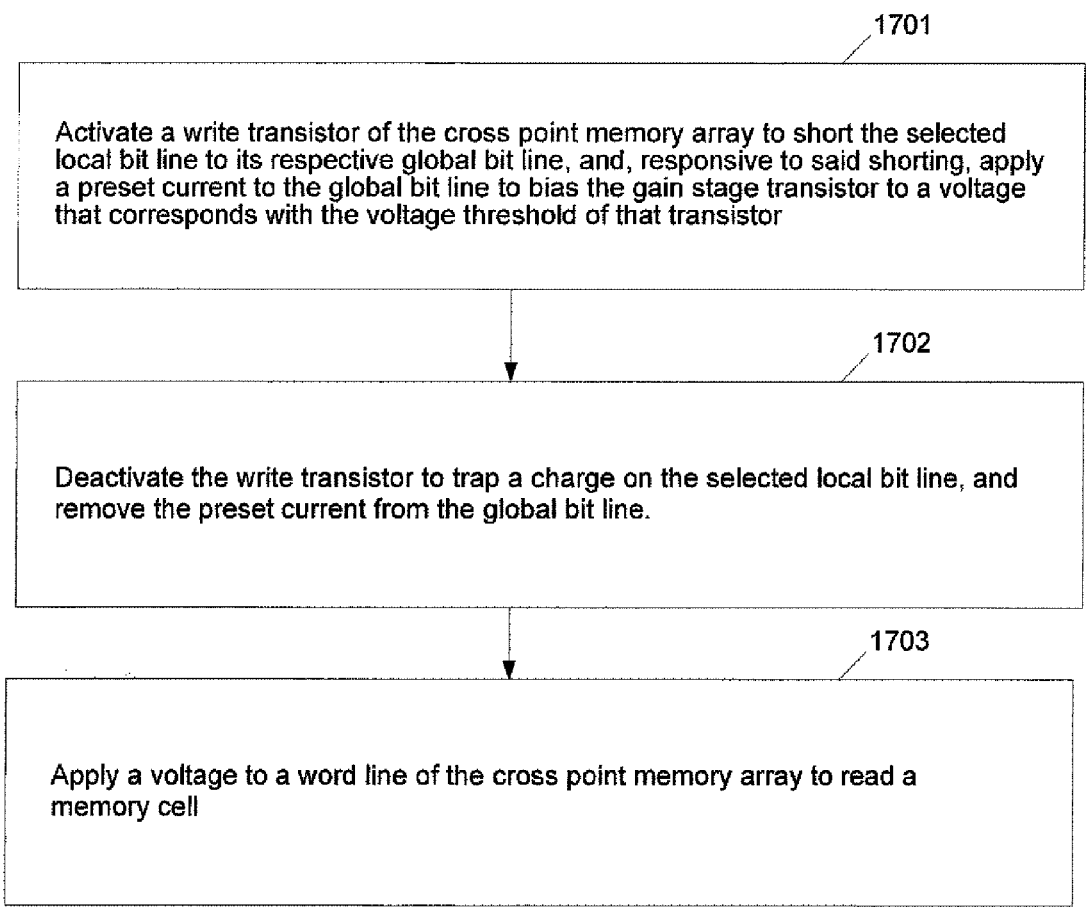
FIG. 17 is a flow chart illustrating another example process for compensating for process, operating voltage, and temperature variations in the memory array of FIG. 1.

FIG. 17 is a flow chart illustrating another example process for compensating for process, operating voltage, and temperature variations in the memory array of FIG. 1 by precharging a selected local bit line, e.g., in dependence upon a voltage threshold of a respective gain stage transistor.

In block 1701, a write transistor of the memory array, e.g., pass gate transistor 204 (FIG. 2), is activated to short the selected local bit line, e.g., LBL 106 (FIG. 2) to its respective global bit line, e.g., GLB (FIG. 2). Responsive to said shorting, a preset current is applied to the global bit line to bias the gain stage transistor, e.g., transistor 206 (FIG. 2), to, e.g., a voltage that corresponds with the voltage threshold of that transistor.

In block 1702, the write transistor is deactivated to trap a charge on the selected local bit line, and the preset current is removed from the global bit line.

In block 1703, a voltage is applied to a word line of the memory array, e.g., one of the word lines WL0-WLK, to read a memory cell, e.g., one of the memory elements 104.

It should be appreciated that the processes described above may be implemented by using a controller coupled to the memory array (and components thereof), e.g., as shown in FIG. 4.

Figure 18A:
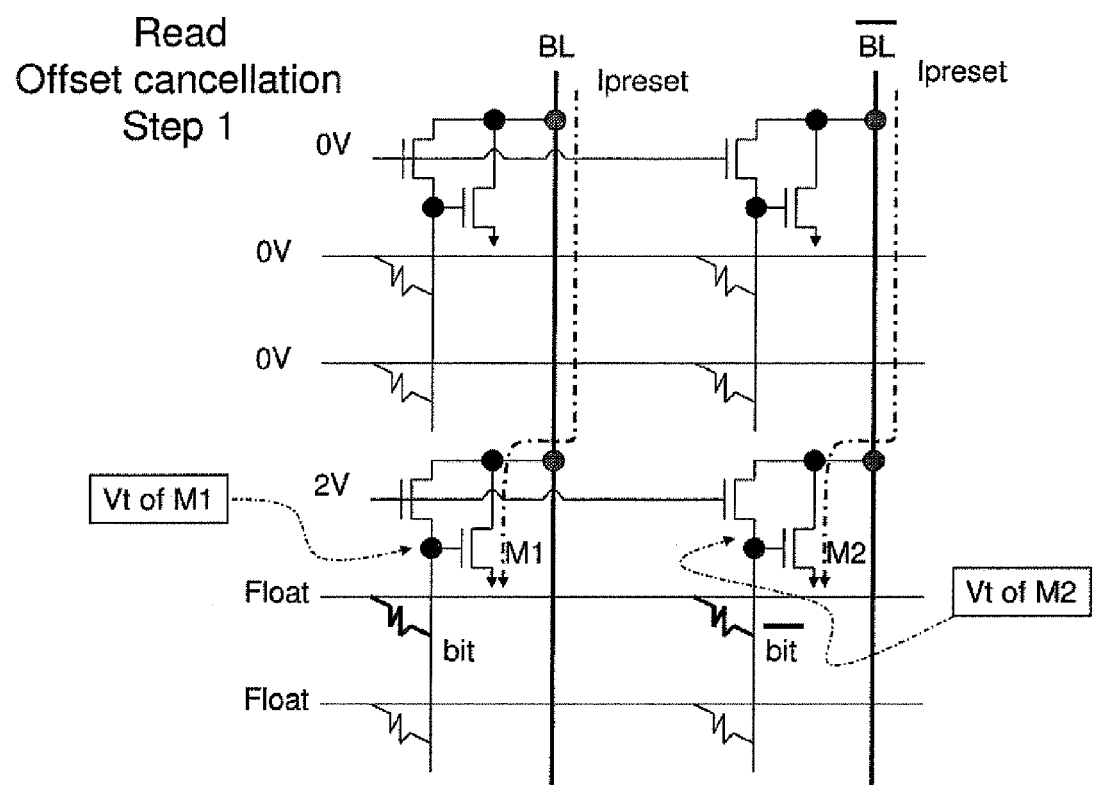
FIGS. 18A-D illustrates a sequence of steps to compensate for PVT variation in a memory array with local bit lines and local-to-global bitline pass gates and gain stages in accordance with the example process of FIG. 17.
Figure 18B:
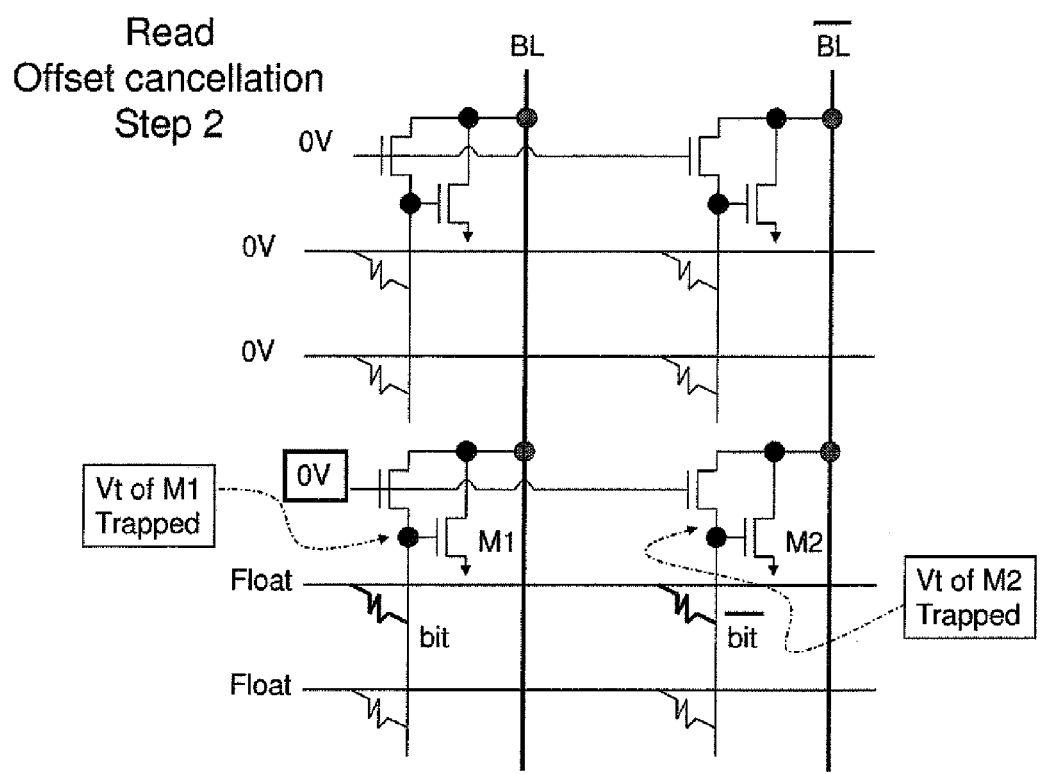
Figure 18C:
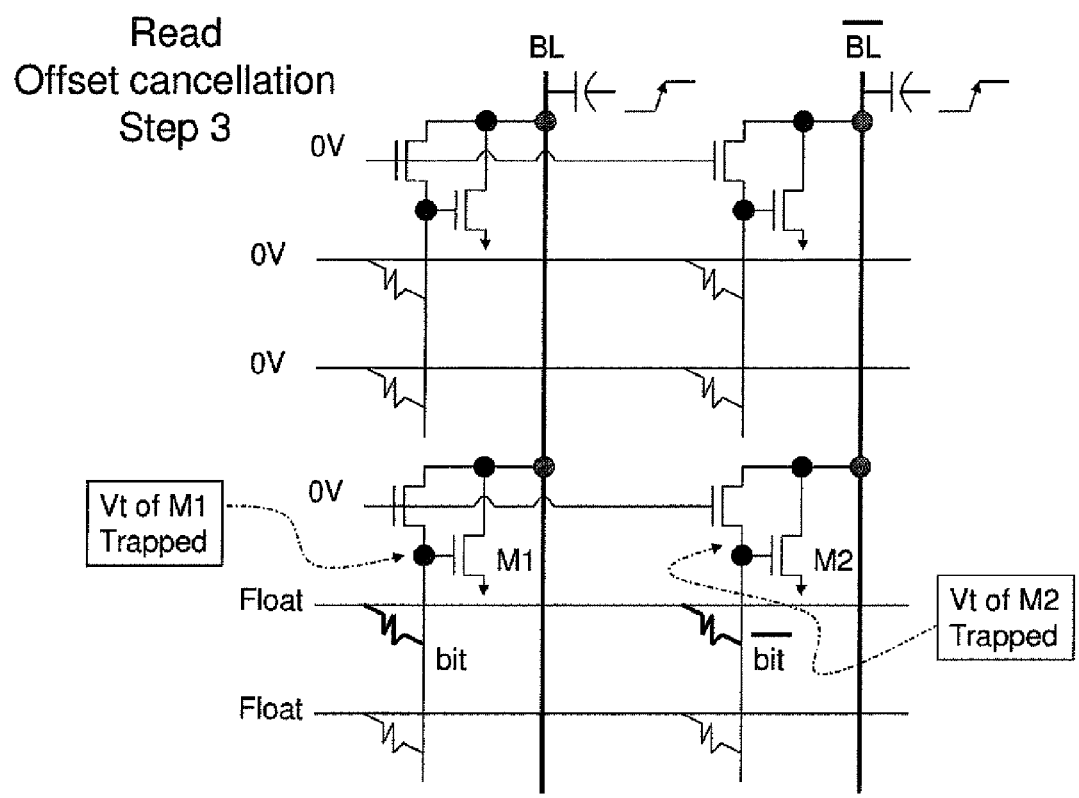
Figure 18D:
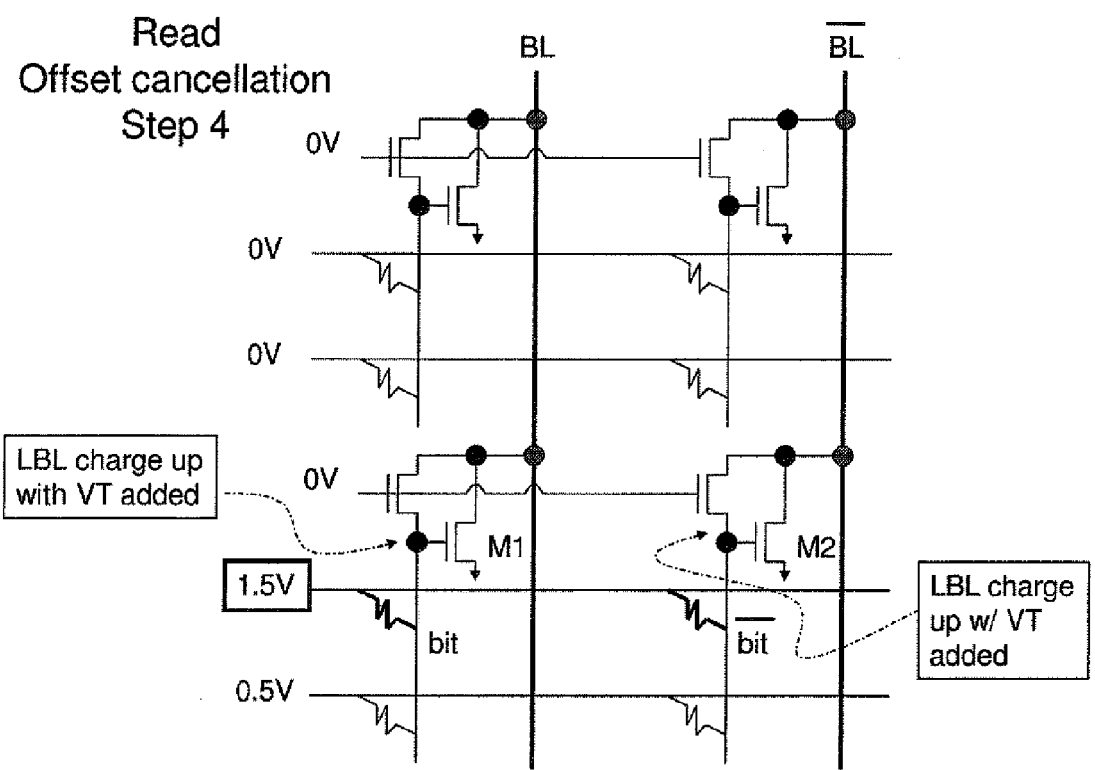

FIGS. 18A-D illustrates a sequence of steps to compensate for PVT variation in a memory array with local bit lines and local-to-global bitline pass gates and gain stages in accordance with the example process of FIG. 17. Referring to FIG. 18A, a current preset is applied to each of the selected global bit lines and a local bit line of the gain stage transistor M1 is biased to a corresponding voltage threshold of M1 and a local bit line of the gain stage transistor M2 is biased to a corresponding voltage threshold of M2, which may be different than the voltage threshold of M1 due to PVT variation. Referring to FIG. 18B, the precharge voltages are trapped by turning off the pass gate transistors corresponding to gain stage transistors M1 and M2. Referring to FIG. 18C, the global bit lines are charged while the local bit lines of the gain stage transistors M1 and M2 are floated. Referring to FIG. 18D, a memory access, e.g., a read operation, may be performed (a selected word line connected to the local bit line are pulled to a first voltage, e.g., 1.5 volts, and unselected word lines(s) are pulled to a different voltage, e.g., 0.5 volts).

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

What is claimed is:

1. A method of operating a cross point memory array comprising a plurality of word lines and a plurality of bit lines, wherein the plurality of bit lines comprises a plurality of local bit lines, each electrically connected to a corresponding one of a plurality of global bit lines by respective corresponding one of a plurality of gain stage transistors, the plurality of gain stage transistors having parameters that vary with respect to at least one of process, voltage, and temperature, the method comprising:

precharging a first selected local bit line of the plurality of local bit lines to a first voltage that varies with the transistor parameters of the corresponding gain stage transistor; and after precharging the first selected local bit line, applying a voltage to a selected word line of the cross point memory array to read a memory cell coupled between the selected local bit line and the selected word line.

2. The method of claim 1, further comprising, coincident with precharging the first selected local bit line, precharging a second selected local bit line of the plurality of local bit lines to a second voltage, different than the first voltage, that varies with the transistor parameters of the gain stage transistor corresponding to the second selected local bit line.

3. The method of claim 1, wherein the first voltage corresponds to a voltage threshold of the corresponding gain stage transistor.

4. The method of claim 1, wherein precharging the first selected local bit line to the first voltage further comprises floating the selected word line.

5. The method of claim 1, wherein precharging the first selected local bit line comprises:
activating a first write transistor of the cross point memory array to short the first local bit line to its corresponding global bit line; and
responsive to said shorting, applying a preset current to the corresponding global bit line to bias the corresponding gain stage transistor to the first voltage.

6. The method of claim 5, wherein a value of the preset current is in correspondence with a value of a read current associated with the memory cell.

7. The method of claim 5, further comprising holding inactive a second write transistor of the cross point memory array while the first write transistor is activated, wherein the second write transistor is coupled to the same global bit line as the first write transistor and corresponds to a non-selected local bit line of the plurality of local bit lines.

8. The method of claim 5, further comprising:
after applying the preset current to the corresponding global bit line, deactivating the first write transistor to trap a charge on the first selected local bit line.

9. The method of claim 8, further comprising:
after deactivating the first write transistor, precharging the corresponding global bit line with a voltage that coincides with a read voltage associated with the memory cell.

10. A memory device, comprising:
a plurality of word lines and a plurality of bit lines, wherein the plurality of bit lines comprises a plurality of local bit lines, each electrically connected to a corresponding one of a plurality of global bit lines by respective corresponding one of a plurality of gain stage transistors, the plurality of gain stage transistors having transistor parameters that vary with at least one of process, voltage, and temperature;
a plurality of two-terminal memory elements, each two-terminal memory element coupled between a respective word line of the plurality of word lines and a respective bit line of the plurality of bit lines;
a controller coupled to the plurality of gain stage transistors, the controller configured to:
precharge a first selected local bit line of the plurality of bit lines to a first voltage that varies with the transistor parameters of the corresponding gain stage transistor; and
after precharging the first selected local bit line, applying a voltage to a selected word line of the cross point memory array to read the memory element coupled between the first selected local bit line and the selected word line.

11. The memory device of claim 10, wherein the controller is further configured to, coincident with precharging the first selected local bit line, precharge a second selected local bit line of the plurality of local bit lines to a second voltage, different than the first voltage, that varies with the transistor parameters of the gain stage transistor corresponding to the second selected local bit line.

12. The memory device of claim 11, wherein the first voltage corresponds to a voltage threshold of the corresponding gain stage transistor.

13. The memory device of claim 10, wherein precharging the first selected local bit line to the first voltage further comprises floating the selected word line.

14. The memory device of claim 10, wherein precharging the first selected local bit line comprises:
activate a first write transistor of the cross point memory array to short the first local bit line to its corresponding global bit line; and
responsive to said shorting, apply a preset current to the corresponding global bit line to bias the corresponding gain stage transistor to the first voltage.

15. The memory device of claim 14, wherein a value of the preset current is in correspondence with a value of a read current associated with the memory cell.

16. The memory device of claim 15, wherein the controller is further configured to hold inactive a second write transistor of the cross point memory array while the first write transistor is activated, wherein the second write transistor is coupled to the same global bit line as the first write transistor and corresponds to a non-selected local bit line of the plurality of local bit lines.

17. The memory device of claim 15, wherein the controller is further configured to:
after applying the preset current to the corresponding global bit line, deactivate the first write transistor to trap a charge on the first selected local bit line.

18. The memory device of claim 17, wherein the controller is further configured to:
after deactivating the first write transistor, precharge the corresponding global bit line with a voltage that coincides with a read voltage associated with the memory cell.

* * * * *